(12) United States Patent
Goda et al.

(10) Patent No.: US 11,404,583 B2
(45) Date of Patent: Aug. 2, 2022

(54) APPARATUS INCLUDING MULTIPLE CHANNEL MATERIALS, AND RELATED METHODS, MEMORY DEVICES, AND ELECTRONIC SYSTEMS

(71) Applicant: Micron Technology, Inc., Boise, ID (US)

(72) Inventors: Akira Goda, Tokyo (JP); Marc Aoulaiche, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/781,733

(22) Filed: Feb. 4, 2020

(65) Prior Publication Data

US 2021/0202751 A1    Jul. 1, 2021

Related U.S. Application Data

(60) Provisional application No. 62/955,529, filed on Dec. 31, 2019.

(51) Int. Cl.
| | | |
|---|---|---|
| *H01L 29/78* | (2006.01) | |
| *H01L 29/786* | (2006.01) | |
| *H01L 29/267* | (2006.01) | |
| *H01L 27/11556* | (2017.01) | |
| *H01L 29/66* | (2006.01) | |
| *H01L 29/10* | (2006.01) | |

(52) U.S. Cl.
CPC .. *H01L 29/78642* (2013.01); *H01L 27/11556* (2013.01); *H01L 29/1037* (2013.01); *H01L 29/267* (2013.01); *H01L 29/6675* (2013.01); *H01L 29/66431* (2013.01)

(58) Field of Classification Search
CPC combination set(s) only.
See application file for complete search history.

(56) References Cited

U.S. PATENT DOCUMENTS

| | | |
|---|---|---|
| 7,829,948 B2 | 11/2010 | Arai et al. |
| 9,343,507 B2 | 5/2016 | Takaki |
| 9,401,371 B1 | 7/2016 | Lee et al. |
| 9,455,269 B1 | 9/2016 | Noda |
| 9,524,980 B2 | 12/2016 | Lue |

(Continued)

OTHER PUBLICATIONS

Fayrushin et al., Semiconductor Devices, Electronic Systems, and Related Methods, U.S. Appl. No. 16/123,538, filed Sep. 6, 2018.

(Continued)

*Primary Examiner* — Moin M Rahman
(74) *Attorney, Agent, or Firm* — TraskBritt

(57) ABSTRACT

An apparatus comprises a stack comprising an alternating sequence of dielectric structures and conductive structures, a first channel material extending vertically through the stack, and a second channel material adjacent the first channel material and extending vertically through the stack. The first channel material has a first band gap and the second channel material has a second band gap that is relatively larger than the first band gap. The apparatus further comprises a conductive plug structure adjacent to each of the first channel material and the second channel material, and a conductive line structure adjacent to the conductive plug structure. Methods of forming the apparatus, memory devices, and electronic systems are also described.

29 Claims, 11 Drawing Sheets

(56) References Cited

U.S. PATENT DOCUMENTS

| | | |
|---|---|---|
| 10,418,369 B2 | 9/2019 | Or-Bach et al. |
| 2012/0299005 A1* | 11/2012 | Lee .................. H01L 27/11582 257/314 |
| 2015/0076580 A1* | 3/2015 | Pachamuthu ..... H01L 27/11582 257/314 |
| 2015/0079742 A1* | 3/2015 | Pachamuthu ....... H01L 29/7926 438/268 |
| 2015/0221666 A1* | 8/2015 | Lee ........................ H01L 29/04 257/329 |
| 2016/0005759 A1* | 1/2016 | Kim .................. H01L 27/11556 257/314 |
| 2016/0104719 A1* | 4/2016 | Jung ................... H01L 27/0688 257/324 |
| 2016/0225785 A1* | 8/2016 | Kim .................. H01L 27/11582 |
| 2016/0240552 A1 | 8/2016 | Arai |
| 2016/0260733 A1 | 9/2016 | Lue |
| 2018/0175050 A1* | 6/2018 | Son .................... H01L 27/11582 |
| 2019/0067326 A1* | 2/2019 | Huang ............. H01L 21/02568 |
| 2019/0067475 A1 | 2/2019 | Liu et al. |
| 2020/0227432 A1* | 7/2020 | Lai .................... H01L 21/76877 |
| 2021/0066458 A1* | 3/2021 | Tak ................... H01L 27/11582 |

OTHER PUBLICATIONS

Hosono, Hideo, Ionic Amorphous Oxide Semiconductors: Material Design, Carrier Transport, and Device Application, Journal of Non-Crystalline Solids, vol. 352, (2006), pp. 851-858.

Saxler, Adam W., Electronic Devices Including Vertical Memory Cells and Related Methods, U.S. Appl. No. 16/555,033, filed Aug. 29, 2019.

Yin et al., Program/Erase Characteristics of Amorphous Gallium Indium Zinc Oxide Nonvolatile Memory, IEEE Transactions on Electron Devices, vol. 55, No. 8, (Aug. 2008), pp. 2071-2077.

* cited by examiner

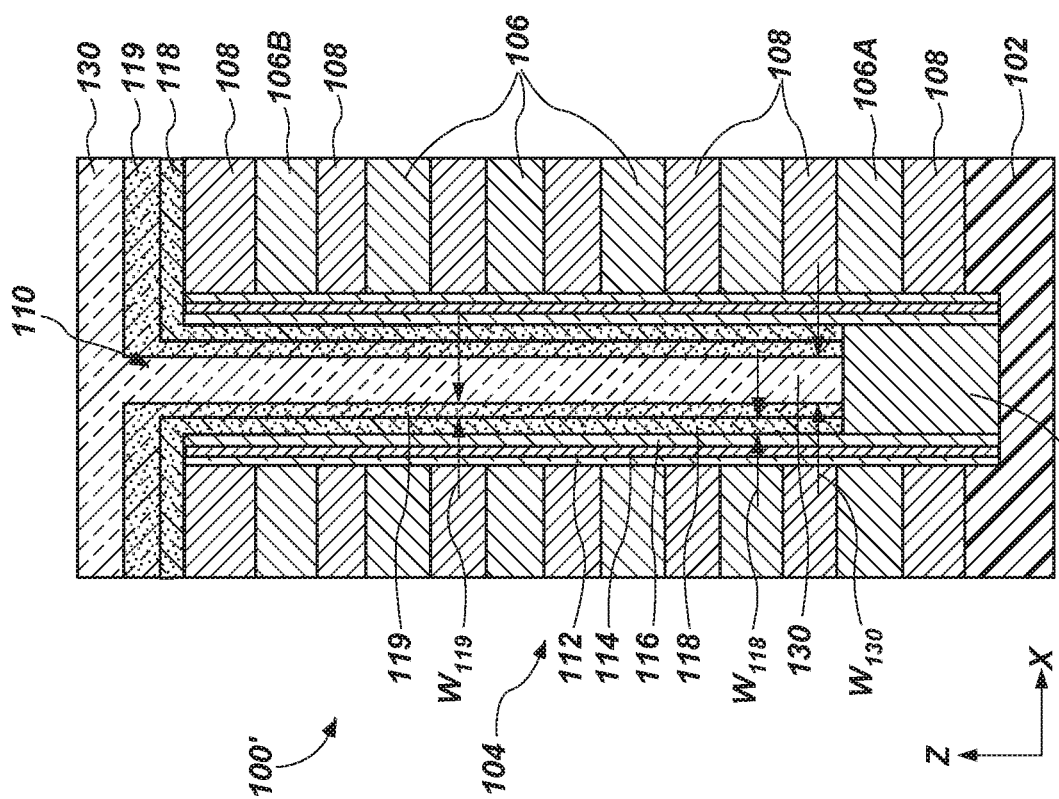
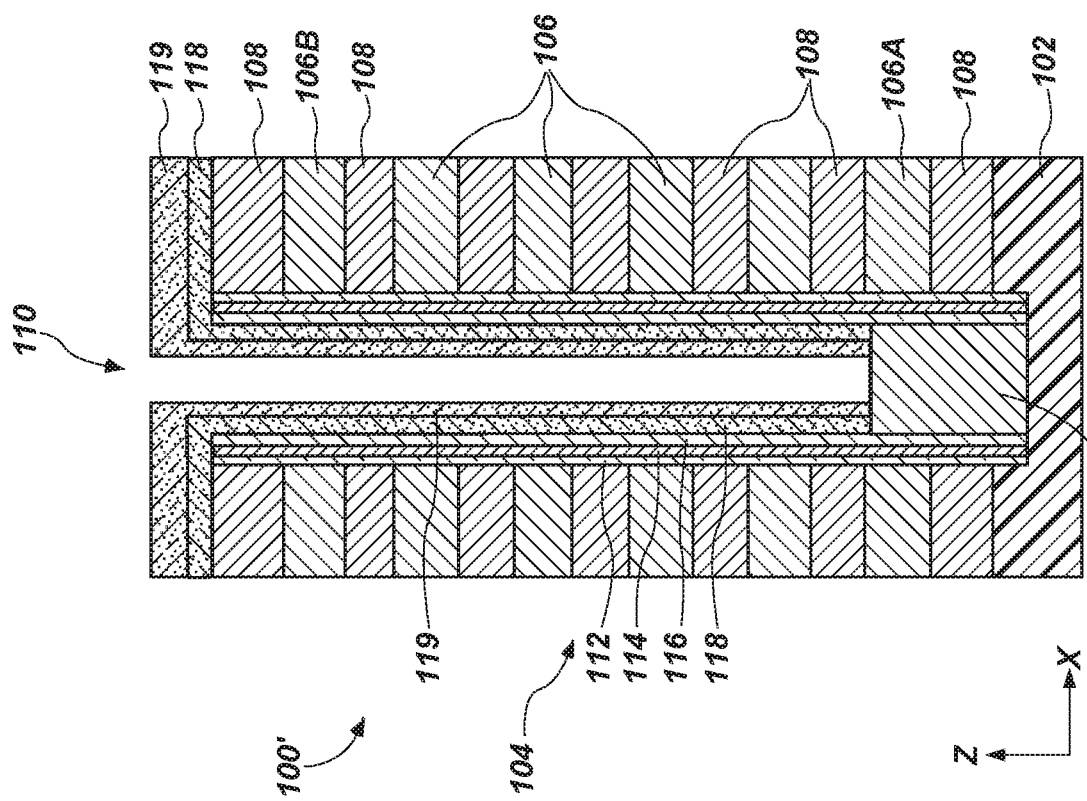

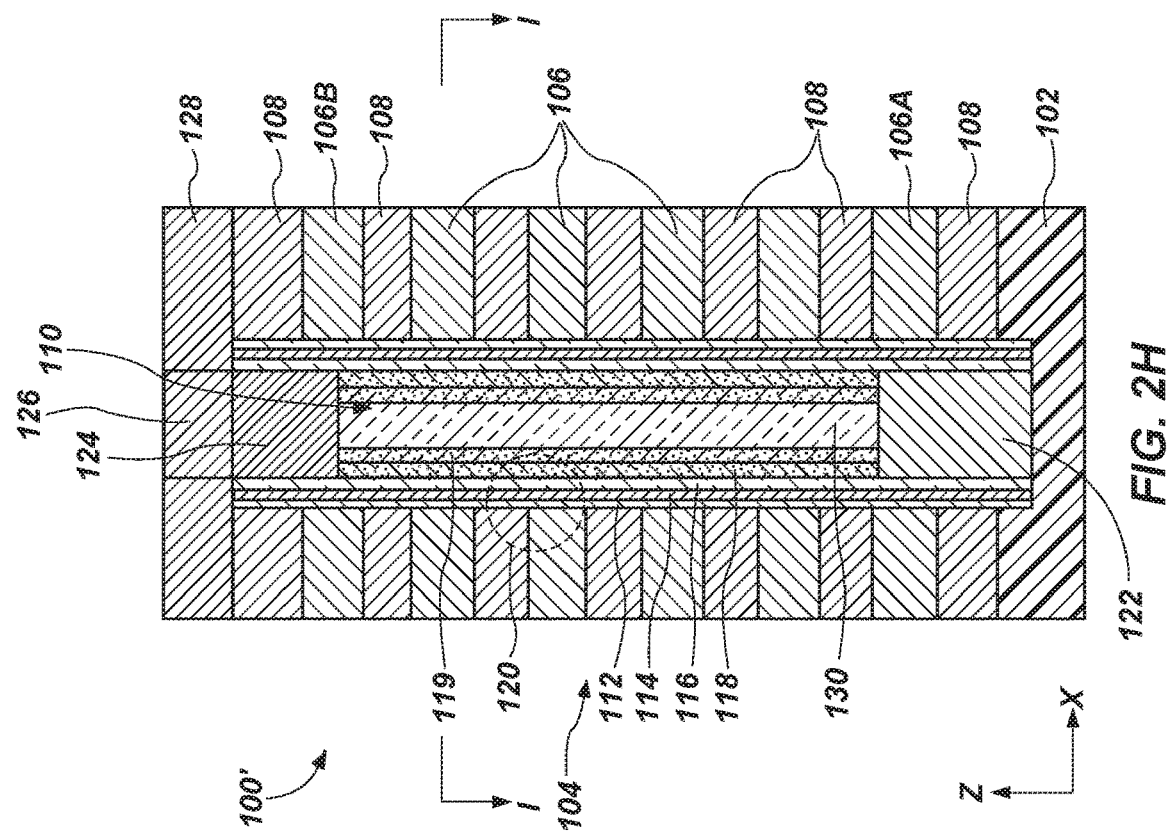
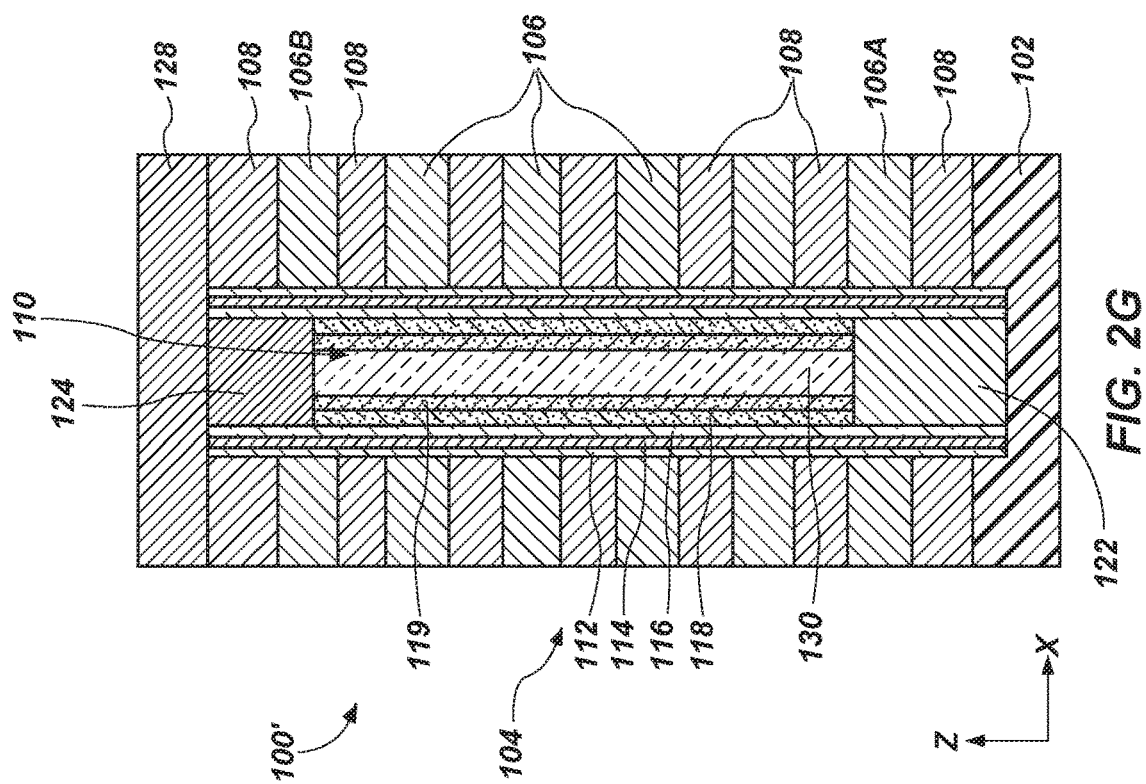

APPARATUS INCLUDING MULTIPLE CHANNEL MATERIALS, AND RELATED METHODS, MEMORY DEVICES, AND ELECTRONIC SYSTEMS

CROSS-REFERENCE TO RELATED APPLICATION

This application claims the benefit under 35 U.S.C. § 119(e) of U.S. Provisional Patent Application Ser. No. 62/955,529, filed Dec. 31, 2019, the disclosure of which is hereby incorporated herein in its entirety by this reference.

TECHNICAL FIELD

Embodiments disclosed herein relate to microelectronic devices and microelectronic device fabrication. More particularly, embodiments of the disclosure relate to an apparatus including a device structure (e.g., a vertical string of memory cells) including multiple channel materials, and to related memory devices and electronic systems, and to methods of forming the apparatus.

BACKGROUND

A NAND Flash memory device is a common type of Flash memory device, so called for the logical form in which the basic memory cell configuration is arranged. Common uses for Flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize architectures including arrays of vertical strings of memory cells. An example of a conventional vertical string of memory cells includes a semiconductive material (e.g., a channel material) vertically extending through an opening in a stack of alternating conductive gate materials (e.g., word lines, control gates, access lines) and dielectric materials, and an oxide-nitride-oxide (ONO) structure positioned laterally between the stack and the semiconductive material of the channel. Each memory cell of the vertical string comprises one of the conductive gate materials and portions of the ONO structure and the semiconductive material laterally-neighboring the one of the conductive gate materials. Such a configuration permits a greater number of memory cells to be located in a given unit of die surface area by building the memory cell arrays upwards (e.g., vertically) on a die, as compared to structures with conventional planar (e.g., two-dimensional) arrangements of cells.

As technology advances in 3D memory devices, arrays of vertical strings of memory cells are being produced and designed with an increased number of alternating conductive gate materials and dielectric materials to increase a number of memory cell access devices (e.g., transistors). This increase results in a stack with a greater height, as well as larger vertical strings of memory cells passing through the stack with the greater height. The semiconductor materials (e.g., channel materials) in the larger vertical strings of memory cells may need to carry an increased current, a so-called "string current," to effectively operate all the memory cells in the vertical string. Using conventional polycrystalline silicon (also known as "polysilicon") materials as the channel material may result in an insufficient gate-induced drain leakage ("GIDL") current for erase functions on such long vertical memory strings. Accordingly, polysilicon or silicon nitride channel materials alone may not be adequate for generating sufficient GIDL current in a reasonable time frame in stacks having a greater height.

BRIEF DESCRIPTION OF THE DRAWINGS

FIGS. 2A through 2I are simplified partial cross-sectional (FIGS. 2A through 2H) and simplified partial top-down (FIG. 2I) views illustrating a method of forming another apparatus including a device structure, in accordance with additional embodiments of the disclosure, where the top-down view of FIG. 2I is taken along line I-I in FIG. 2H.

DETAILED DESCRIPTION

Figure 1B:
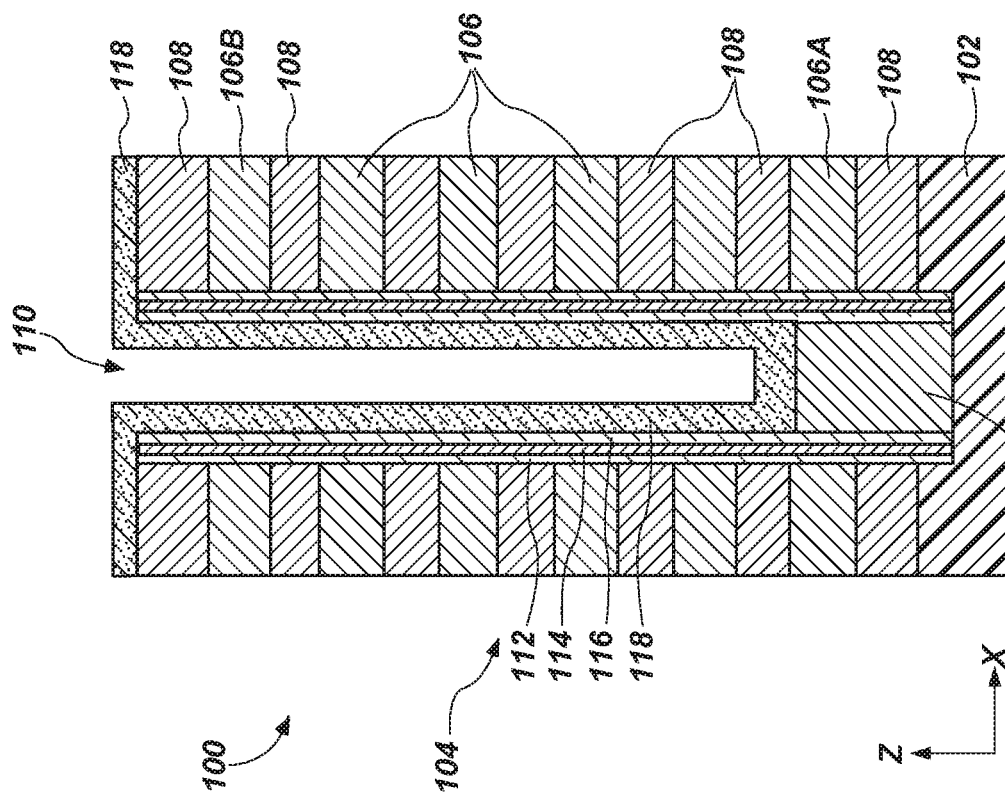
FIGS. 1A through 1H are simplified partial cross-sectional (FIGS. 1A through 1G) and simplified partial top-down (FIG. 1H) views illustrating a method of forming an apparatus including a device structure, in accordance with embodiments of the disclosure, where the top-down view of FIG. 1H is taken along line H-H in FIG. 1G.

An apparatus (e.g., a microelectronic device, a semiconductor device, a memory device) is disclosed that includes a stack comprising an alternating sequence of dielectric structures and conductive structures, a first channel material extending vertically through the stack, and a second channel material adjacent the first channel material and extending vertically through the stack. The first channel material has a first band gap and the second channel material has a second band gap that is relatively larger than the first band gap. The apparatus further comprises a conductive plug structure adjacent (e.g., electrically coupled) to each of the first channel material and the second channel material, and a conductive line structure adjacent (e.g., electrically coupled) to the conductive plug structure. The first channel material is conductive to both electrons and holes and the second channel material is conductive to electrons and is not conductive to holes. For example, the first channel material may include a polysilicon material and the second channel material may include an oxide semiconductor material. The multiple channel materials (e.g., two or more materials) may allow enhanced current transmission to be provided to the apparatus. In some embodiments, the apparatus further comprises a central dielectric material adjacent the second channel material and extending vertically through the stack.

The first channel material may be formed using a conformal deposition process, the second channel material may be formed using a conformal deposition process or a non-conformal deposition process, and the central dielectric material, if present, may be formed using a non-conformal deposition process. The multiple channel materials (e.g., the oxide semiconductor material laterally adjacent to the polysilicon material) may be used to provide enhanced current transmission in 3D memory arrays to enhance electron conductivity without increasing leakage and/or fluctuation of voltage during read and program operations. The apparatus including the first channel material and the second channel material according to embodiments of the disclosure exhibits improved reliability, lower leakage, and improved electron mobility as compared to conventional apparatuses lacking a second, vertically oriented channel material.

The following description provides specific details, such as material compositions and processing conditions, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional fabrication techniques employed in the semiconductor industry. In addition, the description provided below does not form a complete process flow for manufacturing an apparatus. The structures described below do not form a complete microelectronic device. Only those process stages (e.g., acts) and structures necessary to understand the embodiments of the disclosure are described in detail below. Additional stages to form a complete microelectronic device may be performed by conventional fabrication techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "configured" refers to a size, shape, orientation, and arrangement of one or more of at least one structure and at least one apparatus facilitating operation of one or more of the structure and the apparatus in a pre-determined way.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the term "apparatus" includes without limitation a memory device, as well as other microelectronic devices (e.g., semiconductor devices) which may or may not incorporate memory, such as a logic device, a processor device, or a radiofrequency (RF) device. Further, the apparatus may incorporate memory in addition to other functions such as, for example, a so-called "system on a chip" (SoC) including a processor and memory, or an apparatus including logic and memory. The apparatus may be a three-dimensional (3D) microelectronic device including, but not limited to, a 3D NAND Flash memory device, such as a 3D floating gate NAND Flash memory device or a 3D replacement gate NAND Flash memory device.

As used herein, the phrase "coupled to" refers to structures operatively connected with each other, such as electrically connected through a direct ohmic connection or through an indirect connection (e.g., via another structure).

As used herein, the term "amorphous," when referring to a material, means and refers to a material having a substantially noncrystalline structure.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be a semiconductor substrate, a base semiconductor material on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIGS. 1A through 1H illustrate a method of forming a microelectronic device structure (e.g., a memory device structure) including memory cells, at various stages of the method, according to an embodiment of this disclosure. For simplicity, the formation of a single opening in which the memory cells are formed is illustrated, but will be understood by one of ordinary skill in the art that the method may include simultaneously forming multiple (e.g., more than one, an array of) openings in which the memory cells are ultimately to be formed. For convenience in describing FIGS. 1A through 1H, a first direction may be defined as a direction, shown in FIGS. 1A through 1H, as the X-direction. A second direction, which is transverse (e.g., perpendicular) to the first direction, shown in FIG. 1H, as the Y-direction. A third direction, which is transverse (e.g., perpendicular) to each of the first direction and the second direction, may be defined as a direction (e.g., vertical direction), shown in FIGS. 1A through 1G, as the Z-direction. Similar directions may be defined, as shown in FIGS. 2A through 2I, as discussed in greater detail below.

Figure 1A:
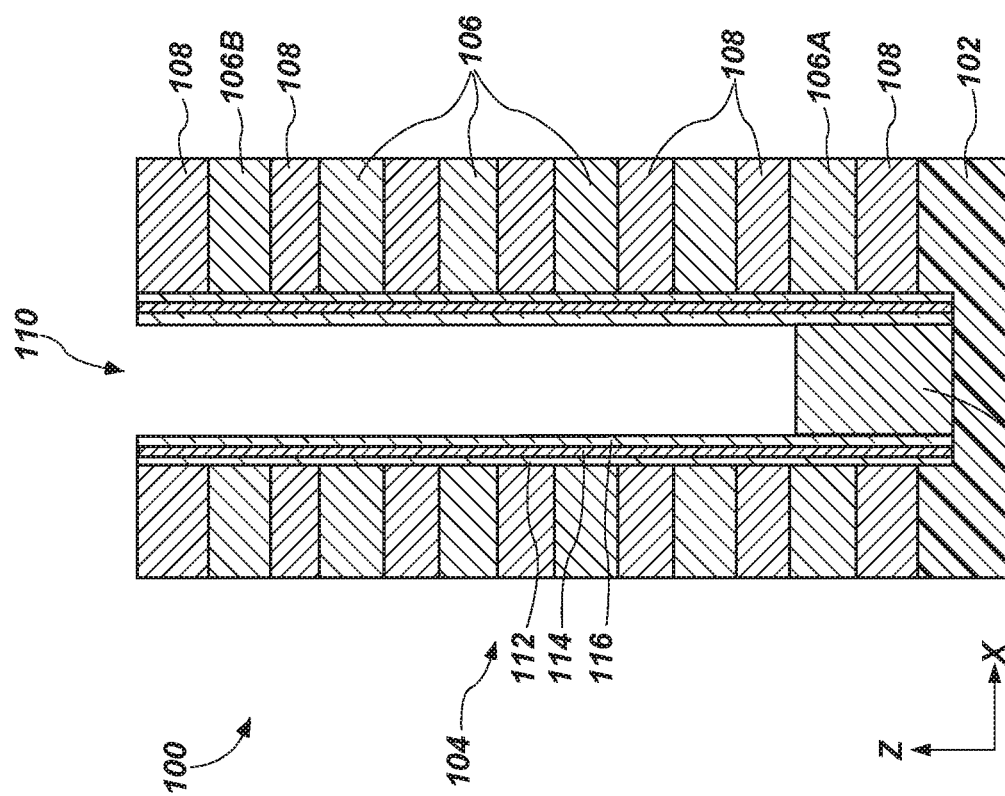

Referring to FIG. 1A, a device structure 100 includes a stack 104 of alternating tiers of conductive materials 106 and dielectric materials 108 overlying a base conductive material 102 (e.g., a conductive line, such as a source line) on a base material (not shown). The conductive materials 106 may be configured as gates. An opening 110 may vertically extend through the stack 104. As shown in FIG. 1A, the opening 110 may comprise a linear, elongated opening (e.g., aperture, via) exhibiting one end at an uppermost surface of the stack 104 and another end at a lowermost surface of the stack 104. In additional embodiments, the opening 110 may exhibit a so-called "U-shaped" configuration having a pair of ends at the uppermost surface of the stack 104. The opening 110 may be a high aspect ratio (HAR) opening, such as having a HAR of at least about 20:1, at least about 50:1, at least about 100:1, or at least about 1000:1. An outer oxide material 112 may be formed laterally adjacent sidewalls of the stack 104 within the opening 110. A nitride material 114 may be formed laterally adjacent to (e.g., inwardly laterally adjacent to) the outer oxide material 112 within the opening 110. An inner oxide material 116 may be formed laterally adjacent to (e.g., inwardly laterally adjacent to) the nitride material 114 within the opening 110. Collectively, the outer oxide material 112, the nitride material 114, and the inner oxide material 116 form an oxide-nitride-oxide (ONO structure). A first plug material 122 (e.g., a source contact plug material) may be formed adjacent to (e.g., on or over) the base conductive material 102 and inwardly laterally adjacent to the inner oxide material 116 within the opening 110. The first plug material 122 may extend upward from the base conductive material 102 to at least partially vertically overlap a lowermost conductive material 106A. An uppermost conductive material 106B may be located remote from the lowermost conductive material 106A and proximate an upper surface of the stack 104.

The alternating conductive materials 106 and the dielectric materials 108 of the stack 104 may each individually be formed using conventional material processes, which are not described in detail herein. As a non-limiting example, the conductive materials 106 and the dielectric materials 108 may each individually be formed through one or more conventional deposition processes (e.g., a PVD process, a CVD process, ALD process, a spin-coating process) to form the stack 104. As another non-limiting example, an initial stack comprising a vertically alternating sequence of sacrificial dielectric materials and the dielectric material is formed through conventional processes (e.g., conventional deposition processes, such as one or more of PVD, CVD, and ALD), and then the sacrificial dielectric materials are removed and replaced with the conductive materials 106 to form the stack 104 through a so-called "replacement gate" process. To remove the sacrificial dielectric materials, one or more slots may be formed through the initial stack to laterally expose the sacrificial dielectric materials, an isotropic etch may be performed to selectively remove the sacrificial dielectric materials and form gaps (e.g., undercuts) between vertically adjacent dielectric materials 108, and then a conductive material (e.g., one or more of titanium, titanium nitride, tantalum, tantalum nitride, tungsten, or tungsten nitride) may be deposited within the gaps to form the conductive materials 106.

Referring to FIG. 1B, a first channel material 118 may be formed within the opening 110 and over exposed upper surfaces of the stack 104. The first channel material 118 may be formed adjacent to (e.g., on) sidewalls of the inner oxide material 116 and over an exposed upper surface of the first plug material 122, as illustrated in FIG. 1B. The first channel material 118 may be formed by a conformal deposition process, such as CVD or ALD. The first channel material 118 may alternatively be epitaxially grown within the opening 110.

The first channel material 118 may be formed to any desirable thickness. By way of non-limiting example, the first channel material 118 may have an average thickness (e.g., width) less than about 25 nanometers (nm), such as within a range of from about 1 nm to about 10 nm or from about 10 nm to about 20 nm. The first channel material 118 may or may not exhibit a substantially homogeneous distribution of the elements thereof. The first channel material 118 may be, in whole or in part, crystalline (e.g., monocrystalline, polycrystalline) or amorphous. The first channel material 118 may be undoped, or may include at least one dopant, such as a p-type dopant or an n-type dopant. In some embodiments, the at least one dopant may include a p-type dopant comprising phosphorous (P) or arsenic (As), for example. The first channel material 118 may include a gradient of the at least one dopant, with a higher dopant concentration and a lower dopant concentration along a vertical portion (e.g., the Z-direction) and/or a horizontal portion (e.g., the X-direction) thereof. A boundary between a region of the higher dopant concentration and another region of the lower dopant concentration may not necessarily be along a straight line.

The first channel material 118 may be, or include, a material that exhibits a room temperature band gap of less than or equal to about 1.4 eV, such as within a range of from about 0.4 eV to about 0.85 eV, from about 0.85 eV to about 1.12 eV, or from about 1.12 eV to about 1.4 eV. Additionally, the first channel material 118 may be a semiconductor material including free charge carriers (e.g., electrons, holes) characterized as a conduction band minimum (CBM) material, which works as an electron pathway, as well as a valence band maximum (VBM) material, acting as a hole pathway. By way of example and not limitation, the first channel material 118 may comprise one or more of polycrystalline silicon (also known as "polysilicon," which has a room temperature band gap of about 1.12 eV), silicon germanium (which has a room temperature band gap of about 0.85 eV), germanium (which has a room temperature band gap of about 0.66 eV), and indium gallium arsenide (which has a room temperature band gap of about 0.7 eV).

Figure 1D:
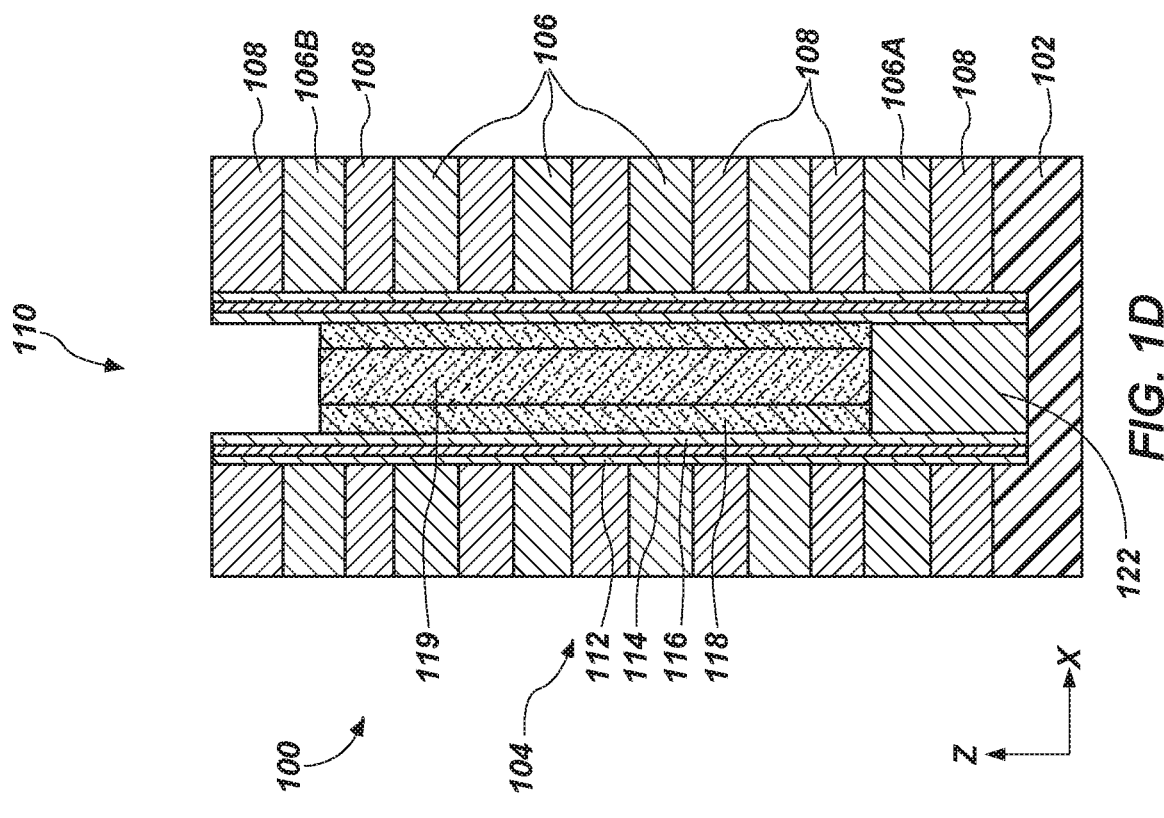
Figure 1C:
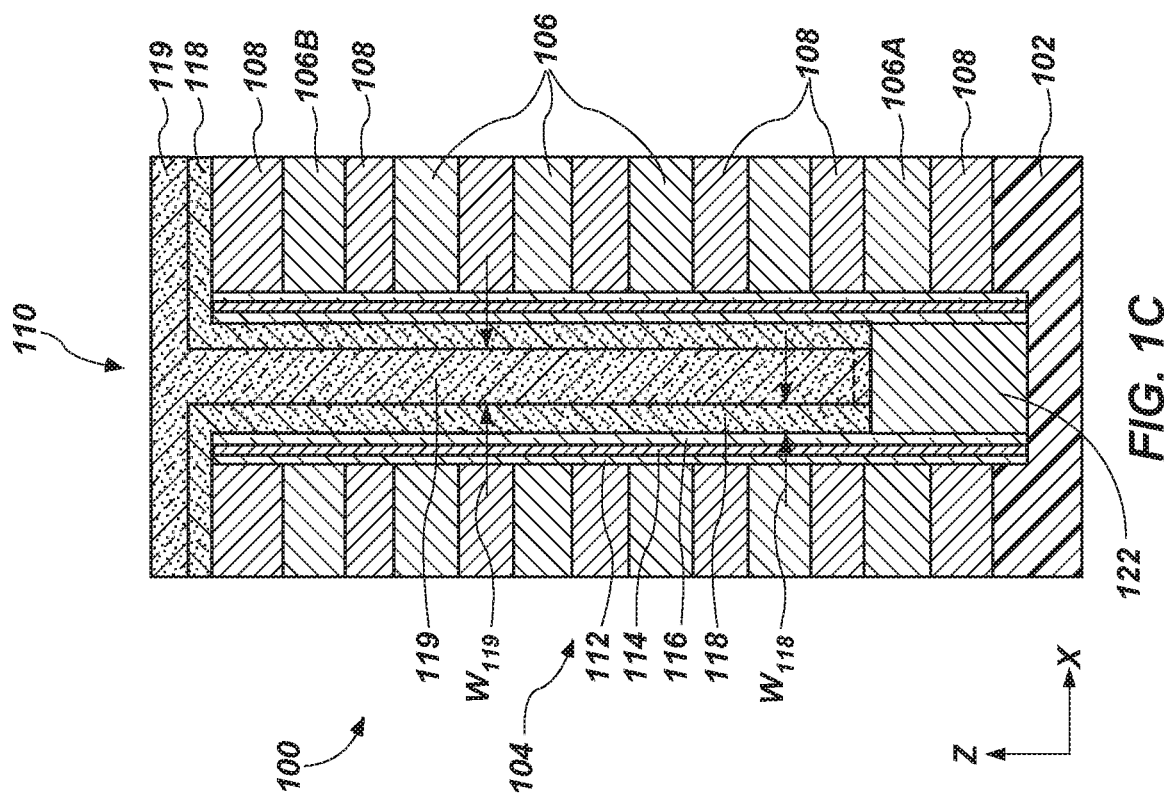

Referring to FIG. 1C, a second channel material 119 may be formed (e.g., non-conformally formed) inwardly laterally adjacent to the first channel material 118 within the opening 110 and over exposed upper surfaces of the first channel material 118 overlying the stack 104. The second channel material 119 may substantially completely fill a remainder of the opening 110 (e.g., a substantial cylindrical opening) so as to fully laterally extend between the sidewalls of the first channel material 118 within the opening 110. In some embodiments, the second channel material 119 may be in direct physical contact with the first channel material 118 along one or more interfaces (e.g., a single interface), for example, along a vertical interface therebetween. In other embodiments, one or more optional materials (e.g., barrier materials, charge storage materials, etc.) (not shown) may be located between the second channel material 119 and the first channel material 118. As shown in FIG. 1C, the first channel material 118 may substantially surround (e.g., substantially continuously surround) the second channel material 119 along an entire height thereof. In other words, the first channel material 118 and the second channel material 119 may be substantially coextensive along the vertical interface therebetween. In some embodiments, the second channel material 119 may be formed on the sidewalls of the first channel material 118 and over the exposed upper surface of the first plug material 122, as illustrated in FIG. 1C. For example, the second channel material 119 may be in direct physical contact with the first plug material 122. In such embodiments, portions of the first channel material 118 may initially be formed adjacent to (e.g., over) the exposed upper surface of the first plug material 122, which is subsequently removed from the upper surface of the first plug material 122 using one or more conventional removal processes, such as one or more so-called "punch etch" processes prior to formation of the second channel material 119. In other embodiments, horizontal portions of the first channel material 118 adjacent to the first plug material 122 may remain between the second channel material 119 and the first plug material 122, as shown in dashed lines in FIG. 1C.

The second channel material 119 may be formed using one or more conventional conformal deposition processes, such as one or more of a conventional conformal CVD process or a conventional ALD process. Alternatively, the second channel material 119 may be formed using one or more conventional non-conformal deposition processes, such as one or more of a conventional PVD process (e.g., a conventional radio frequency PVD (RFPVD) process), or a conventional non-conformal CVD process. The second channel material 119 may alternatively be epitaxially grown within the opening 110.

Other processing conditions of forming the first and second channel materials 118, 119, such as temperature or pressure of the deposition act, may be selected as appropriate to achieve the desired composition of the first and second channel materials 118, 119. By way of non-limiting example, the process temperature may be less than about 600° C., such as between about 200° C. and about 400° C. or between about 400° C. and about 600° C.

The second channel material 119 may be formed to any desirable thickness. By way of non-limiting example, the second channel material 119 may have an average thickness (e.g., width) less than about 100 nm, such as within a range of from about 10 nm to about 50 nm or from about 50 nm to about 100 nm. In some embodiments, a width $W_{119}$ of the second channel material 119 may be substantially the same as a width $W_{118}$ of the first channel material 118. For example, each of the first channel material 118 and the second channel material 119 may occupy about one-half of a cross-sectional area of a remaining portion of the opening 110 illustrated in FIG. 1A. In other embodiments, the width $W_{119}$ of the second channel material 119 may differ from (e.g., be relatively greater than or relatively less than) the width $W_{118}$ of the first channel material 118. The second channel material 119 may or may not exhibit a substantially homogeneous distribution of the elements thereof. The second channel material 119 may be, in whole or in part, crystalline (e.g., monocrystalline) or amorphous. In addition, a material form of the second channel material 119 may be the same as, or different than, a material form of the first channel material 118. For example, the material form of the second channel material 119 may be amorphous (e.g., having a substantially noncrystalline structure) and the material form of the first channel material 118 may include small grains of a semiconductive material (e.g., crystalline silicon) within an amorphous phase.

The second channel material 119 may be undoped, or may include at least one dopant. In some embodiments, the at least one dopant may be a p-type dopant. In other embodiments, the at least one dopant may be an n-type dopant including, but not limited to, aluminum (Al) or silicon (Si) but excluding phosphorous (P) or arsenic (As). In addition, the at least one dopant of the second channel material 119 may be the same as, or different than, the at least one dopant of the first channel material 118. For example, the at least one dopant of the second channel material 119 may be an n-type dopant and the at least one dopant of the first channel material 118 may be a p-type dopant. Alternatively, the dopants of the first channel material 118 and the second channel material 119 may be the same type (e.g., an n-type dopant) having differing concentrations relative to one another. The second channel material 119 may include a gradient of the at least one dopant, with a higher dopant concentration and a lower dopant concentration along a vertical portion (e.g., the Z-direction) and/or a horizontal portion (e.g., the X-direction) thereof. A boundary between a region of the higher dopant concentration and another region of the lower dopant concentration may not necessarily be along a straight line.

By way of non-limiting example, the second channel material 119 may comprise an oxide semiconductor material, such as zinc tin oxide ($Zn_xSn_yO$, commonly referred to as "ZTO"), indium zinc oxide ($In_xZn_yO$, commonly referred to as "IZO"), indium tin oxide ($In_xSn_yO_z$, commonly referred to as "ITO"), zinc oxide ($Zn_xO$), indium gallium zinc oxide ($In_xGa_yZn_zO$, commonly referred to as "IGZO") (e.g., amorphous IGZO), indium gallium silicon oxide ($In_x$-$Ga_ySiZO_a$, commonly referred to as "IGSO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), indium zinc oxide ($In_xZn_yO$), indium gallium zinc oxide ($In_xGa_yZn_zO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), indium aluminum gallium oxide ($In_xA$-$l_yGa_zO_a$), indium aluminum gallium nitride ($In_xAl_yGa_zN$), silicon indium zinc oxide ($Si_xIn_yZn_zO$), zinc tin oxide ($Zn_xSn_yO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), indium gallium silicon oxide ($In_xGa_ySi_zO$), or a similar material. Formulae including at least one of "x," "y," "z," and "a" above (e.g., $Zn_xSn_yO$, $In_xZn_yO$, $In_x$-$Ga_yZn_zO$, $In_xGa_ySi_zO$, $Al_xSn_yIn_zZn_aO$) represent a composite material that contains an average ratio of "x" atoms of one element, "y" atoms of another element (if any), "z" atoms of an additional element (if any), and "a" atoms of a further element (if any) for every one atom of oxygen (O). As the formulae are representative of relative atomic ratios and not strict chemical structure, the second channel material 119 may comprise a stoichiometric compound or a non-stoichiometric compound, and the values of "x," "y," "z," and "a" may be integers or may be non-integers. As used herein, the term "non-stoichiometric compound" means and includes a chemical compound with an elemental composition that cannot be represented by a ratio of well-defined natural numbers and is in violation of the law of definite proportions. The second channel material 119 may include stoichiometric variations of the listed materials, and/or combinations of materials (e.g., $InGaZnO_3$, $In_2Zn_3O_6$, etc.).

The second channel material 119 may be, or include, a material that exhibits a room temperature band gap of higher than about 1.5 eV, such as within a range of from about 1.5 eV to about 3.0 eV or from about 3.0 eV to about 4.0 eV. A band gap of the second channel material 119 may be different than (e.g., relatively higher than) a band gap of the first channel material 118. By way of non-limiting example, a band gap of the first channel material 118 may be about 1.12 eV and a band gap of the second channel material 119 may be about 3.4 eV (e.g., about 3.45 eV). The second channel material 119 may also have high electron mobility. As used herein, "high mobility" means and includes electron mobility of greater than about 5 $cm^2/V·s$ (e.g., at least about 10 $cm^2/V·s$, e.g., 10 $cm^2V·s$ to about 50 $cm^2/V·s$, e.g., greater than about 15 $cm^2V·s$). Therefore, the second channel material 119 may have a relatively higher electron mobility than an electron mobility of the first channel material 118 (e.g., polysilicon, which has an electron mobility of from about 5 $cm^2V·s$ to about 15 $cm^2V·s$). Additionally, the second channel material 119 may be a semiconductor material including free charge carriers (e.g., electrons) characterized as a conduction band minimum (CBM) material (e.g., acting as an electron pathway) without being a valence band maximum (VBM) material (e.g., without acting as a hole pathway). Stated another way, the second channel material 119 may be conductive to electrons without being conductive to holes, while the first channel material 118 may be conductive to electrons as well as being conductive to holes. The material of the second channel material 119 may also be less susceptible to voltage variation than that of the first channel material 118. By using multiple channel materials, in combination, the device structure 100 is less susceptible to leakage during read and program operations of the device containing the device structure 100. The use of more than one channel material may enable improved reliability, lower leakage, and improved mobility as compared to device structures including only one channel material (e.g., a polysilicon material).

Referring to FIG. 1D, portions of the first channel material 118 and the second channel material 119 vertically extending beyond a plane of the upper surface of the stack 104 (e.g., external to the opening 110) may be removed, such as by CMP or etching. Additionally, portions of each of the first channel material 118 and the second channel material 119 may be selectively removed, such as by etching, to recess the first channel material 118 and the second channel material 119 within the opening 110. Uppermost surfaces of remaining portions of each of the first channel material 118 and the second channel material 119 within the opening 110 may be below (e.g., vertically recessed from) an uppermost surface of the stack 104 and may be below an upper surface of the uppermost conductive material 106B, as shown in FIG. 1D. In some embodiments, upper surfaces of the first channel material 118 and the second channel material 119 may be substantially coplanar with one another. In other embodiments, the upper surface of the second channel material 119 may differ from (e.g., be relatively higher or relatively lower than) the upper surface of the first channel material 118.

Figure 1E:
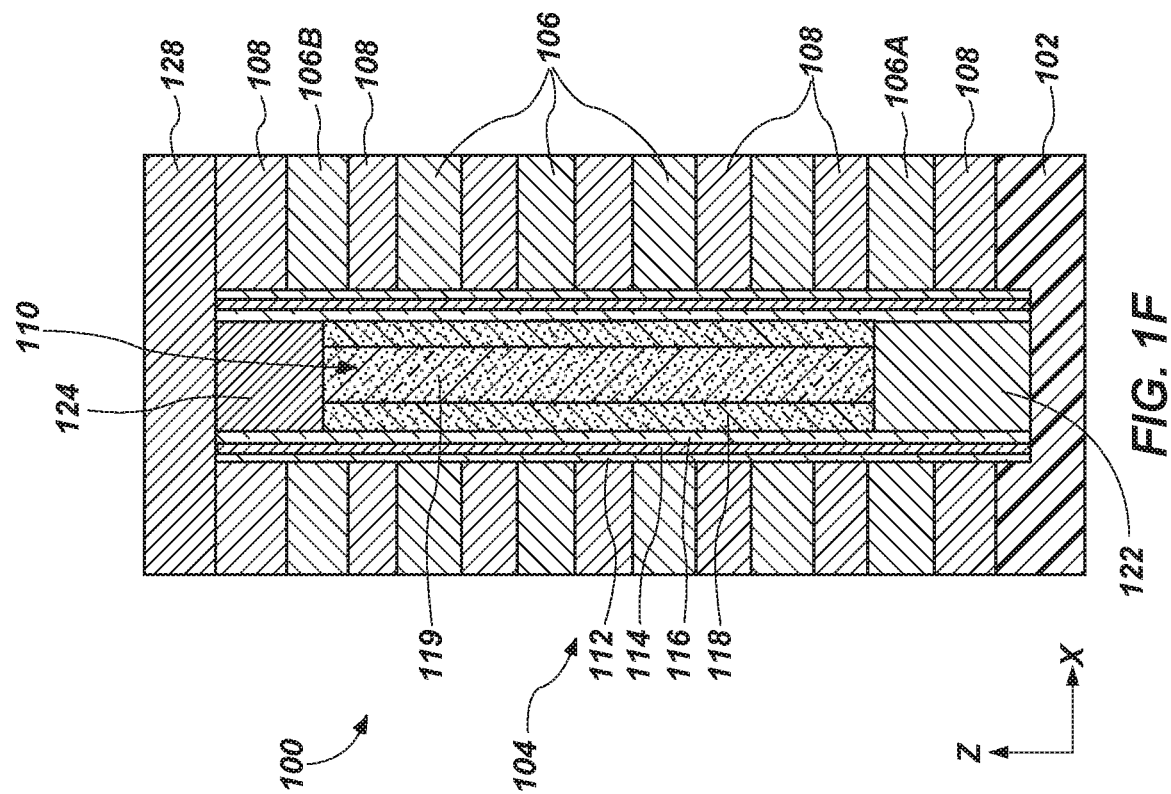

Referring next to FIG. 1E, a second plug material 124 (e.g., a drain contact plug material) may be formed within and fill a remainder of the opening 110. The second plug material 124 may be adjacent (e.g., electrically coupled) to each of the first channel material 118 and the second channel material 119. The second plug material 124 may comprise a semiconductor material, such as one or more of polysilicon, silicon germanium, and germanium. The second plug material 124 may be conductively doped. By way of non-limiting example, the second plug material 124 may include a first concentration of an n-type dopant and the second channel material 119 may include a second concentration of an n-type dopant that differs from (e.g., is relatively greater than or relatively less than) the first concentration. The process for forming the second plug material 124 may be, for example, CVD or ALD.

In some embodiments, a band gap of the second plug material 124 may be different than (e.g., relatively larger or smaller than) a band gap of the first channel material 118 and/or the second channel material 119. By way of example and not limitation, the second plug material 124 may exhibit a room temperature band gap of at least about 1.40 eV. In other embodiments, a band gap of the second plug material 124 may be substantially similar to (e.g., substantially equal to) a band gap of at least one of the channel materials (e.g., the first channel material 118). In additional embodiments, a band gap of the second plug material 124 may be smaller than a band gap of each of the first channel material 118 and the second channel material 119. In such embodiments, for example, the second plug material 124 may include a germanium-containing material, while each of the first channel material 118 and the second channel material 119 includes one or more relatively larger band gap materials, such as polysilicon and an oxide semiconductor material. Thus, a band gap of the second channel material 119 may be relatively larger than a band gap of the second plug material 124, as well as the first channel material 118. Forming the second channel material 119 from a material that exhibits a room temperature band gap of higher than about 1.5 eV (e.g., about 3.4 eV) may increase a gate-induced drain leakage ("GIDL") current in vertical string erase operations of a resulting device (e.g., a memory device) compared to only providing a single channel material (e.g., the first channel material 118) exhibiting a band gap of smaller than about 1.4 eV (e.g., about 1.12 eV), which band gap may be substantially similar to a band gap of the second plug material 124.

The second plug material 124 may initially be formed adjacent to (e.g., over) an upper surface of the stack 104, in addition to within the opening 110. Portions of the second plug material 124 vertically extending beyond a plane of the upper surface of the stack 104 may subsequently be removed, such as by CMP or etching. Remaining portions of the second plug material 124 may be in direct physical contact with and electrically coupled to each of the first channel material 118 and the second channel material 119. For example, portions of the second plug material 124 may vertically overlie and be in direct physical contact with upper surfaces of the remaining portions of each of the first channel material 118 and the second channel material 119 while being adjacent to, inside, and in direct physical contact with a sidewall of the inner oxide material 116 such that a maximum lateral extent of the second plug material 124 is substantially equal to a maximum lateral extent of the first channel material 118, as shown in FIG. 1E.

The uppermost conductive material 106B may have a vertical thickness that is greater than respective thicknesses of the other conductive materials 106 of the stack 104. The relatively greater vertical thickness of the uppermost conductive material 106B may facilitate a relatively larger error margin when forming an extent of the second plug material 124 to at least partially vertically overlap the uppermost conductive gate material 106B. By way of example and not limitation, the vertical thickness of the uppermost conductive material 106B may be greater than or equal to about 45 nm, while the respective vertical thicknesses of the other conductive material 106 may be about 35 nm.

Figure 1F:
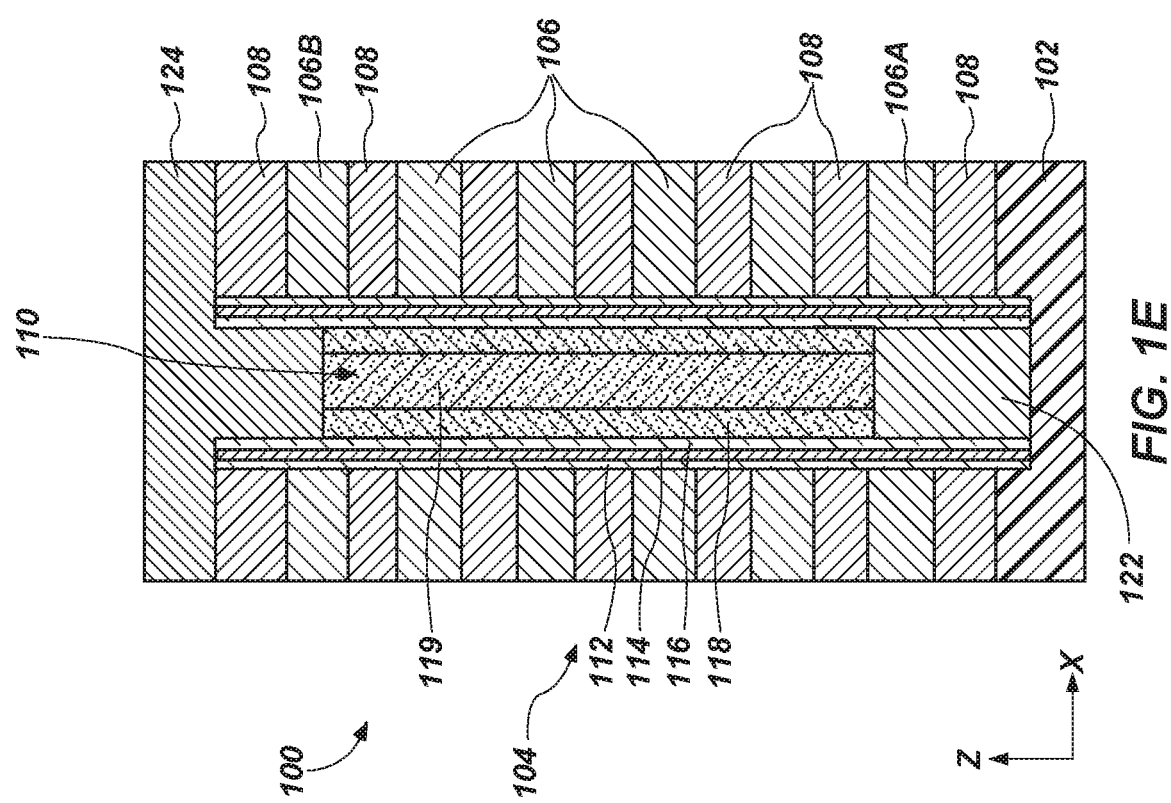

Referring to FIG. 1F, a cap material 128 may be formed on or over upper surfaces of each of the stack 104, the outer oxide material 112, the nitride material 114, the inner oxide material 116, and the second plug material 124. The cap material 128 may include one or more dielectric materials, such as one or more of a silicon oxide (e.g., silicon dioxide) and silicon nitride. The cap material 128 may be formed using one or more conventional processes (e.g., conventional deposition processes, conventional material removal processes) and conventional processing equipment, which are not described in detail herein. For example, the cap material 128 may be deposited (e.g., through one or more of CVD, PVD, ALD, spin-coating) over upper surfaces of the stack 104, the outer oxide material 112, the nitride material 114, and the inner oxide material 116, and the second plug material 124.

Figure 1H:
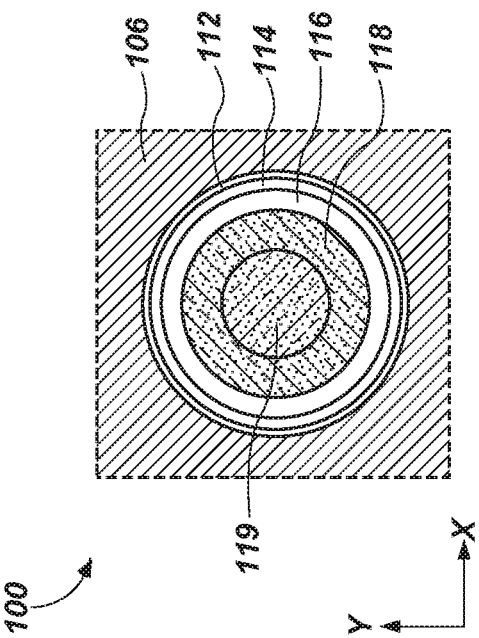
Figure 1G:
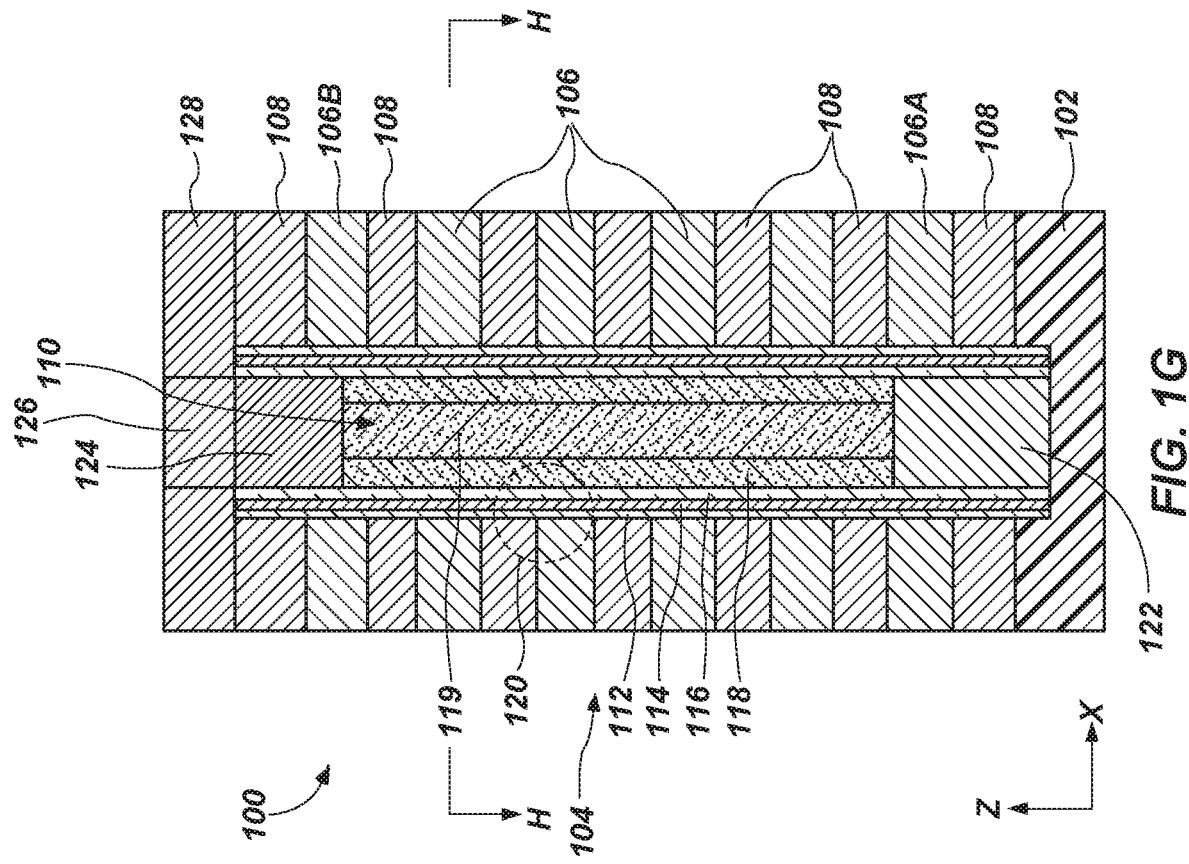

Referring to FIG. 1G, a data line 126 (e.g., bit line, digit line) may be formed on or over uppermost surfaces of the second plug material 124. The data line 126 may be formed using one or more conventional processes (e.g., conventional deposition processes, conventional material removal processes) and conventional processing equipment, which are not described in detail herein. For example, portions of the cap material 128 overlying the second plug material 124 may be removed (e.g., through a conventional photolithographic patterning and etching process) to form a plug opening (not shown) overlying the second plug material 124. A conductive material (e.g., tungsten, tungsten nitride, titanium, titanium nitride) may be formed into the plug opening and excess portions of the conductive material may be removed (e.g., through a CMP process) to form the data lines 126. The data lines 126 may laterally extend perpendicular to the conductive materials 106 of the stack 104.

With continued reference to FIG. 1G, an individual (e.g., single, one) conductive material 106 of the stack 104, and adjacent portions of the outer oxide material 112, the nitride material 114, the inner oxide material 116, the first channel material 118, and the second channel material 119 laterally neighboring the individual conductive materials 106 may form an individual vertical memory cell 120 having a so-called metal-oxide-nitride-oxide-semiconductor ("MONOS") configuration. A vertical stack of multiple (e.g., more than one) vertical memory cells 120 within the opening 110 may form a vertical string (e.g., vertical series) of the memory cells 120. By way of non-limiting example, the device structure 100 includes three-dimensional NAND Flash memory cells. The data line 126 may provide electrical access to the vertical string of memory cells 120. One or more (e.g., from one to five) of the lowermost conductive materials 106, 106A may be configured as select gate sources ("SGSs"). One or more (e.g., from one to five) of the uppermost conductive materials 106, 106B may be configured as select gate drains ("SGDs"). The conductive materials 106 between the select gate source(s) and the select gate drain(s) may be configured as access lines (e.g., word lines). There may be any suitable number of access lines in the stack 104, such as about 32, about 64, about 72, about 96, or about 128, for example.

FIG. 1H illustrates a simplified partial top-down view of the device structure 100 of FIG. 1G, taken along section line H-H. The opening 110 (FIG. 1G) may include a substantially round (e.g., substantially circular) horizontal cross-sectional area. In other embodiments, the horizontal cross-sectional shape of the opening 110 may have an alternative shape (e.g., non-curved, non-round, non-circular). As best shown in the top-down view of FIG. 1H, the outer oxide material 112 is laterally adjacent to the conductive materials 106 and the dielectric materials 108 of the stack 104 (FIG. 1G), the nitride material 114 is laterally adjacent to the outer oxide material 112, and the inner oxide material 116 is laterally adjacent to the nitride material 114. The first channel material 118 may be laterally adjacent to the inner oxide material 116 and the second channel material 119 may be laterally adjacent to the first channel material 118. The inclusion of the second channel material 119 adjacent to the first channel material 118 may enhance electron conductivity without increasing leakage during read and program operations to allow improved reliability, lower leakage, and improved mobility during operation compared to conventional apparatuses having a single (e.g., one) channel material.

With reference to FIG. 1G in combination with FIG. 1H, the data line 126 and the second plug material 124 may be coupled to one another along a horizontal interface therebetween. In addition, the second plug material 124 may be coupled to the first channel material 118 along a horizontal interface therebetween, which may be a so-called "homojunction" wherein the materials of the second plug material 124 and the first channel material 118 are substantially similar (e.g., substantially the same composition) and, thus, exhibit substantially similar (e.g., equal) band gaps on each side of the interface. By way of example and not limitation, each of the second plug material 124 and the first channel material 118 may include a polysilicon material exhibiting substantially equal band gaps. Moreover, the first channel material 118 and the second channel material 119 may be coupled to one another along a vertical interface therebetween. The vertical interface may be a so-called "heterojunction" wherein the materials of the first channel material 118 and the second channel material 119 are different and/or exhibit one or more of different dopant concentrations and different dopant distributions, which enhances band bending adjacent the heterojunction, which enhances confinement of charge carriers (e.g., electrons) to the first channel material 118 and the second channel material 119. As such, the first channel material 118 and the second channel material 119 may have, different (e.g., unequal) band gaps than one another. In some embodiments, the first channel material 118 may be in direct physical contact with and substantially surround (e.g., substantially continuously surround) the second channel material 119, as shown in FIG. 1H. In other embodiments, the positions of the first channel material 118 (e.g., a polysilicon material) and the second channel material 119 (e.g., an oxide semiconductor material) may be reversed such that the first channel material 118 is located within the central portion of the opening 110 (FIG. 1G) and the second channel material 119 may be in direct physical contact with and substantially surround (e.g., substantially continuously surround) the first channel material 118.

During use and operation, electrical current may flow between the materials (e.g., polysilicon materials) of the second plug material 124 and at least one (e.g., each) of the first channel material 118 and the second channel material 119. Including the second channel material 119 (e.g., an oxide semiconductor material) adjacent to the first channel material 118 enables increased current during read operations without increasing leakage during read and boost operations, which allows a greater cross-sectional area of the channel material to generate GIDL current. Stated another way, the presence of the second channel material 119 provides increased electron conductivity during read operations, while the first channel material 118 provides conductivity to generate GIDL-induced holes and to conduct the holes through the vertical string for block erase of memory cells. Thus, the second channel material 119 enables increased electron conduction while reducing (e.g., minimizing) leakage during read and program operations, as compared to a conventional channel only including a single channel material.

During operation of the device structure 100, electrical current may be applied to the data line 126, establishing a flow of electrical current (e.g., string current) through at least a portion of the second plug material 124 and to the first channel material 118 and the second channel material 119. Without being bound to any theory, it is believed that as the current flows from the data line 126 to at least one (e.g., each) of the first channel material 118 and the second channel material 119 through the second plug material 124, a generation region may be established along the interfaces located therebetween. As the electrical current flows proximate the interfaces during GIDL mode, band-to-band tunneling ("BTBT") may be generated (e.g., enhanced) in the generation region located along at least one (e.g., each) of the interfaces. Since the electrical current flows through the second channel material 119 as well as through the first channel material 118, the flow of electrical current is not reduced (e.g., diminished) during a sensing operation. Thus, BTBT may be established or increased due, at least in part, to the second channel material 119 having a different band gap than that of each of the second plug material 124 and the first channel material 118, without decreasing the electrical current supplied to the vertical string of memory cells 120. The increased GIDL current allows more reliable charge flow into the first channel material 118 and the second channel material 119 to bias a body region of individual memory cells 120. A reliable bias voltage is desirable in a number of memory operations, such as erase operations, where large voltage differences are used.

During a programming operation, at least one (e.g., each) of the first channel material 118 and the second channel material 119 of non-selected strings may be biased using a boost operation to inhibit the charge storage structures of the non-selected strings from being erased in memory cells 120 that are not selected for an erase operation. In a boost operation, a voltage may be applied to the first channel material 118 and the second channel material 119, at least in part, through capacitive coupling of the first channel material 118 and the second channel material 119 to an applied voltage on respective gates of individual memory cells 120. For example, a voltage (e.g., about 10 volts) may be placed on the gates, and some amount of that bias voltage (e.g., about 7 volts) may be transferred to the first channel material 118 and the second channel material 119 through coupling. In some embodiments, the applied voltage may be a negative voltage, for example, applied to the uppermost conductive material 106B. Using a boost operation, charge may be maintained within the second channel material 119 with reduced (e.g., minimal) leakage to the second plug material 124 and/or the first plug material 122. As a result, a low GIDL current is desirable during a boost operation. Thus, using more than one (e.g., two or more) channel materials having differing band gaps, as described above, may provide reliable biasing during an erase operation, and may also provide reliable charge maintenance during a boost operation. Stated another way, a greater combined cross-sectional area of the first channel material 118 and the second channel material 119 may be utilized for so-called "on" current while a lesser cross-sectional area of the first channel material 118 (e.g., alone) may be utilized for so-called "off" current to improve string current. Therefore, the device structure 100 functions as a thick channel (e.g., the combined first channel material 118 and second channel material 119) for on current and a thin channel (e.g., the first channel material 118) for off current. The combined first channel material 118 and second channel material 119 enables the on current to be increased during read operation without increasing the leakage at during read operation, which enables an increased level of "on" current without increasing leakage during "off" current and/or fluctuation of voltage associated with possible trap sites in the polysilicon material of the first channel material 118.

Thus, in accordance with embodiments of the disclosure, an apparatus comprises a stack comprising an alternating sequence of dielectric structures and conductive structures, a first channel material extending vertically through the stack, and a second channel material adjacent the first channel material and extending vertically through the stack. The first channel material has a first band gap and the second channel material has a second band gap that is relatively larger than the first band gap. The apparatus further comprises a conductive plug structure adjacent to each of the first channel material and the second channel material, and a conductive line structure adjacent to the conductive plug structure.

Moreover, in accordance with embodiments of the disclosure, a method of forming an apparatus comprises forming an opening through a stack of alternating conductive materials and dielectric materials. The method comprises forming a first channel material within the opening. The method also comprises forming a second channel material within the opening and adjacent to the first channel material. The method further comprises forming a plug material within the opening and adjacent to each of the first channel material and the second channel material, and a band gap of the second channel material is different than that of each of the first channel material and the plug material.

One of ordinary skill in the art will appreciate that, in accordance with additional embodiments of the disclosure, the features and feature configurations described above in relation to FIGS. 1A through 1H may be adapted to design needs of different microelectronic devices (e.g., different memory devices). By way of non-limiting example, in accordance with additional embodiments of the disclosure, FIGS. 2A through 2I show simplified, partial cross-sectional views of a method of forming a microelectronic device structure having a different configuration than the device structure 100. Throughout the remaining description and the accompanying figures, functionally similar features (e.g., structures, devices) are referred to with similar reference numerals. To avoid repetition, not all features shown in the remaining figures (including FIGS. 2A through 2I) are described in detail herein. Rather, unless described otherwise below, a feature designated by a reference numeral of a previously-described feature (whether the previously-described feature is first described before the present paragraph, or is first described after the present paragraph) will be understood to be substantially similar to the previously-described feature.

Figure 2A:
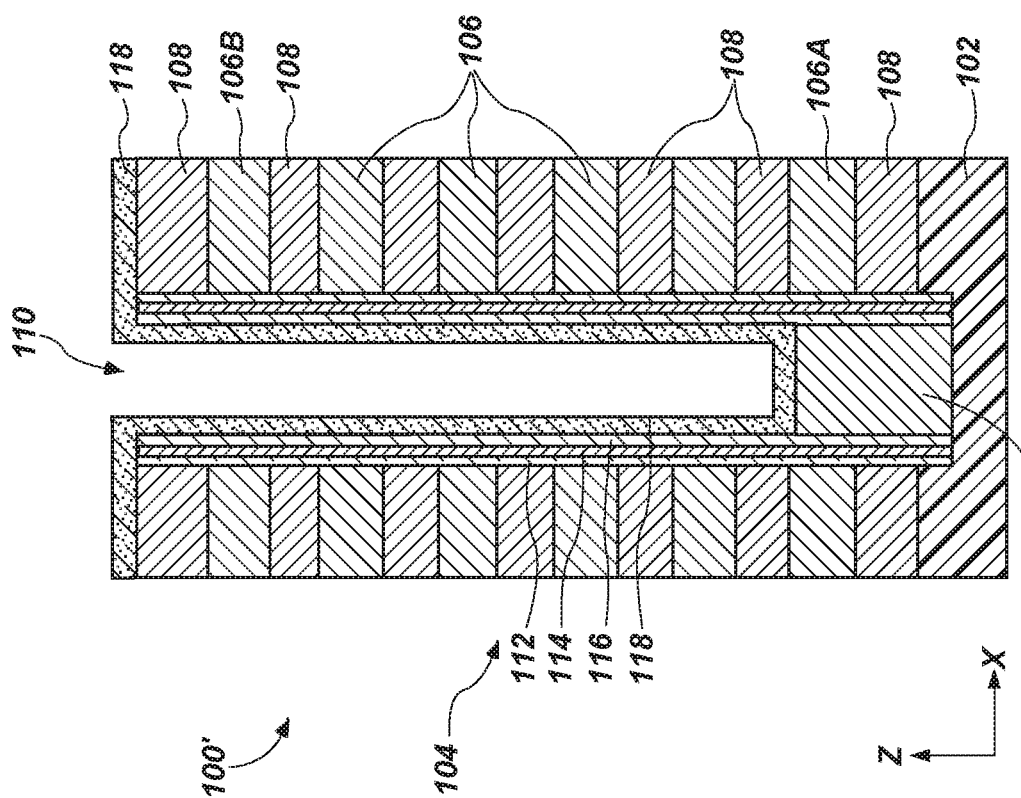

FIG. 2A illustrates a simplified partial cross-sectional view of a device structure 100'. At the processing stage depicted in FIG. 2A, the device structure 100' may be substantially similar to the device structure 100 at the processing stage depicted in FIG. 1A.

Figure 2B:
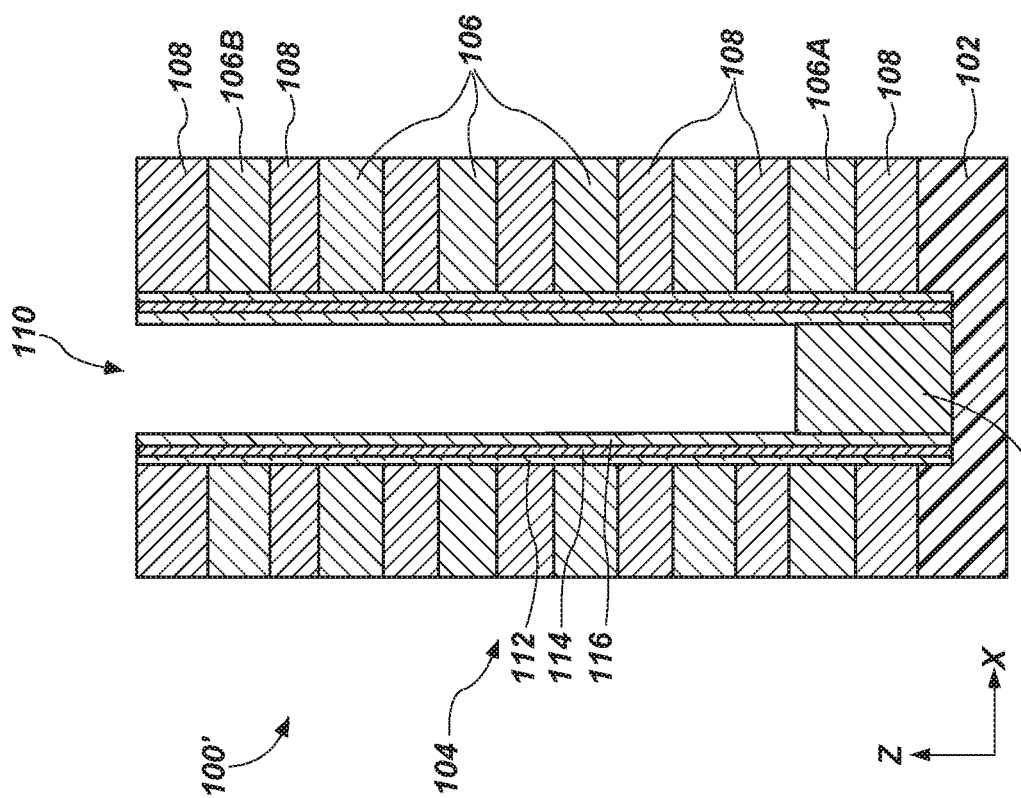

Referring to FIG. 2B, the first channel material 118 may be formed (e.g., conformally formed) over exposed surfaces of the device structure 100' inside and outside of the opening 110 vertically extending through the stack 104. In some embodiments, the first channel material 118 may be epitaxially grown within the opening 110. The first channel material 118 may include substantially the same materials and properties (e.g., structure, dopant, band gap, etc.) as the first channel material 118 described above with reference to FIG. 1B.

Referring to FIG. 2C, the second channel material 119 may be formed adjacent to (e.g., over) exposed surfaces of the device structure 100' inside and outside of the opening 110 vertically extending through the stack 104. For example, the second channel material 119 may be formed adjacent to (e.g., over) exposed surfaces of the first channel material 118, as in the previous embodiment of FIG. 1C. However, the second channel material 119 may be conformally formed on the first channel material 118, without substantially completely filling the opening 110. The second channel material 119 may be formed by a conformal deposition process, such as CVD or ALD. The second channel material 119 may alternatively be epitaxially grown within the opening 110. The second channel material 119 may be formed to any desirable thickness. By way of non-limiting example, the second channel material 119 may comprise an average thickness (e.g., width) less than about 25 nm, such as within a range of from about 1 nm to about 10 nm or from about 10 nm to about 20 nm. The second channel material 119 may include substantially the same materials and properties (e.g., structure, dopant, band gap, electron mobility, etc.) as the second channel material 119 described above with reference to FIG. 1C.

Referring to FIG. 2D, a central dielectric material 130 may be formed adjacent to the second channel material 119 within the opening 110. The central dielectric material 130 may substantially completely fill the opening 110 (e.g., a substantially cylindrical opening) so as to fully laterally extend between sidewalls of the second channel material 119 within the opening 110. The central dielectric material 130 may be formed in a central portion of the opening 110 and may function, for example, as a structural support within the device structure 100'. As shown in FIG. 2D, the second channel material 119 may substantially surround (e.g., substantially continuously surround) the central dielectric material 130. The central dielectric material 130 may be formed to any desirable thickness. By way of non-limiting example, the central dielectric material 130 may have an average thickness (e.g., width) less than about 100 nm, such as within a range of from about 20 nm to about 50 nm or from about 50 nm to about 100 nm. In some embodiments, the width $W_{119}$ of the second channel material 119 may be substantially similar to (e.g., substantially the same as) the width $W_{118}$ of the first channel material 118. In other embodiments, the width $W_{119}$ of the second channel material 119 may differ from (e.g., be relatively greater than or relatively less than) the width $W_{118}$ of the first channel material 118. Moreover, a width $W_{130}$ of the central dielectric material 130 may be relatively greater than at least one (e.g., each) of the width $W_{119}$ of the second channel material 119 and the width $W_{118}$ of the first channel material 118. The width $W_{130}$ of the central dielectric material 130 may also be greater than a combined width of the width $W_{118}$ of the first channel material 118 and the width $W_{119}$ of the second channel material 119. Alternatively, the $W_{130}$ of the central dielectric material 130 may be substantially similar to or relatively less than the width $W_{119}$ of the second channel material 119 and/or the width $W_{118}$ of the first channel material 118.

The central dielectric material 130 may be formed of and include, but is not limited to, an oxide (e.g., silicon dioxide ($SiO_2$)), a nitride (e.g., silicon nitride (SiN)), or an oxynitride. In some embodiments, the central dielectric material 130 is a high quality silicon oxide material, such as an ALD $SiO_x$. For example, the central dielectric material 130 may be a highly uniform and highly conformal silicon oxide material (e.g., a highly uniform and highly conformal silicon dioxide material) so that voids are not present in the central portion. The central dielectric material 130 may be highly uniform and highly conformal as deposited. In particular, the central dielectric material 130 may be formulated to be formed in the HAR opening 110, without forming voids. In other embodiments, the central dielectric material 130 may be formed of and include a material suitable for non-conformal deposition within the opening 110. In additional embodiments, the central dielectric material 130 may be formed of and include an air-filled void.

The central dielectric material 130 may be formed using one or more conventional conformal deposition processes, such as one or more of a conventional conformal CVD process or a conventional ALD process. Alternatively, the central dielectric material 130 may be formed using one or more conventional non-conformal deposition processes, such as one or more of a conventional PVD process (e.g., a conventional radio frequency PVD (RFPVD) process), or a conventional non-conformal CVD process.

Figure 2E:
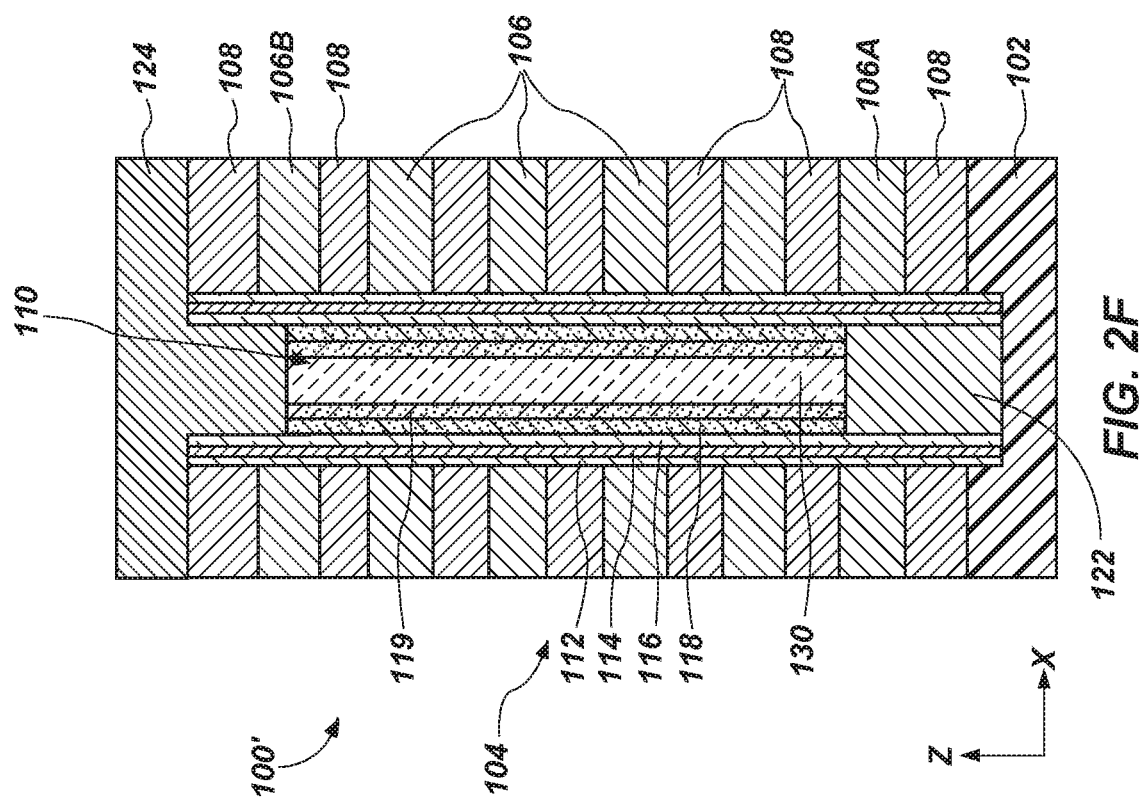

Referring to FIG. 2E, portions of the first channel material 118, the second channel material 119, and the central dielectric material 130 vertically extending beyond a plane of the upper surface of the stack 104 may subsequently be removed, such as by CMP or etching. Additionally, portions of each of the first channel material 118, the second channel material 119, and the central dielectric material 130 within the opening 110 may be selectively removed, such as by etching. Uppermost surfaces of remaining portions of each of the first channel material 118, the second channel material 119, and the central dielectric material 130 within the opening 110 may be below (e.g., vertically recessed from) an uppermost surface of the stack 104 and may be below an upper surface of the uppermost conductive material 106B, as shown in FIG. 2E. In some embodiments, upper surfaces of the first channel material 118, the second channel material 119, and the central dielectric material 130 may be substantially coplanar with one another. In other embodiments, the upper surfaces of the first channel material 118 and/or the second channel material 119 may differ from (e.g., be relatively higher or relatively lower than) one another, as well as the upper surface of the central dielectric material 130.

Figure 2F:
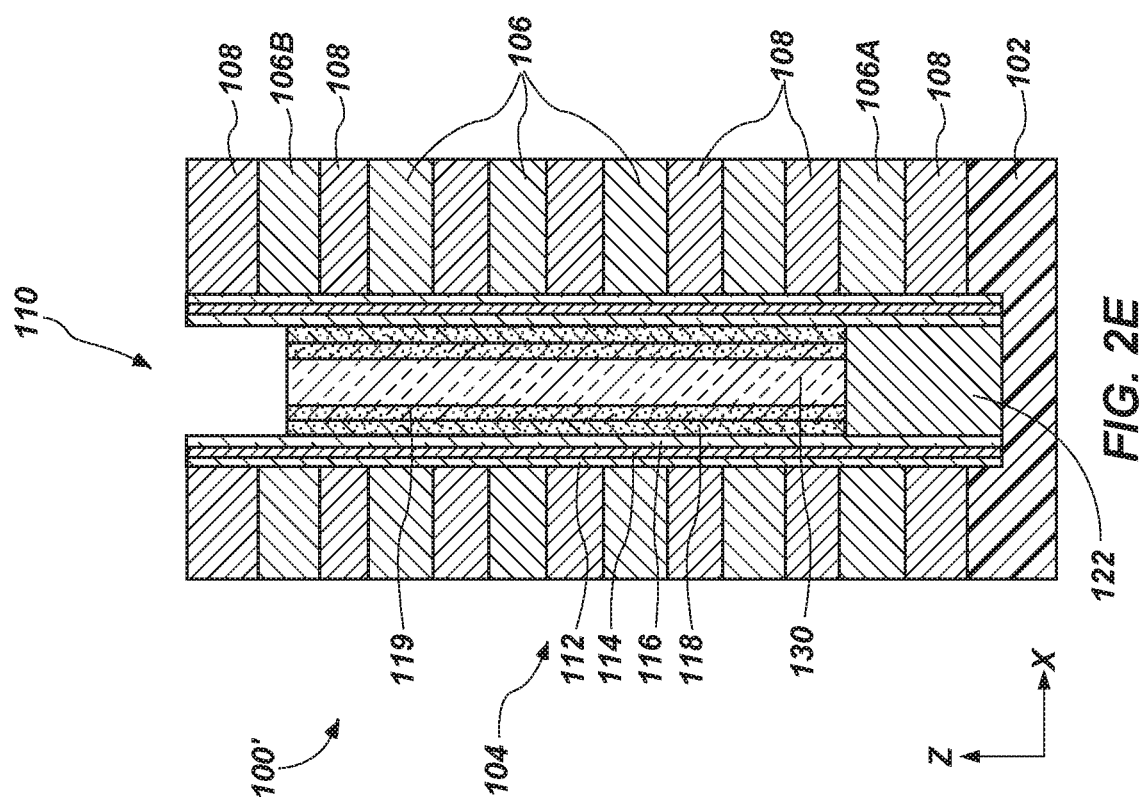

Referring to FIG. 2F, the second plug material 124 may be formed within and fill a remainder of the opening 110. The second plug material 124 may be adjacent (e.g., electrically coupled) to each of the first channel material 118 and the second channel material 119. The second plug material 124 may include substantially the same materials and properties (e.g., dopant, band gap, etc.) as the second plug material 124 described above with reference to FIG. 1E. The second plug material 124 may be formed using processes (e.g., deposition and material removal processes) substantially similar to those previously described with reference to FIG. 1E. For example, the second plug material 124 may initially be formed adjacent to (e.g., over) an upper surface of the stack 104, in addition to within the opening 110. Portions of the second plug material 124 vertically extending beyond a plane of the upper surface of the stack 104 may subsequently be removed, such as by CMP or etching. Remaining portions of the second plug material 124 may be in direct physical contact with and electrically coupled to each of the first channel material 118 and the second channel material 119. For example, portions of the second plug material 124 may vertically overlie and be in direct physical contact with the upper surfaces of the first channel material 118, the second channel material 119, and the central dielectric material 130 while being adjacent to, inside, and in direct physical contact with the inner oxide material 116 such that a maximum lateral extent of the second plug material 124 is substantially equal to a maximum lateral extent of the first channel material 118, as shown in FIG. 2F.

Referring to FIG. 2G, the cap material 128 may be formed on or over upper surfaces of the stack 104, the outer oxide material 112, the nitride material 114, and the inner oxide material 116. The cap material 128 may be substantially similar to and may be formed in substantially the same manner as the cap material 128 previously described with reference to FIG. 1F.

Referring to FIG. 2H, the data line 126 (e.g., bit line, digit line) may be formed on or over uppermost surfaces of the second plug material 124 upon removal of portions of the cap material 128. The data line 126 may be substantially similar to and may be formed in substantially the same manner as the data line 126 previously described with reference to FIG. 1G. The data line 126 may provide electrical access to the vertical string of memory cells 120.

Figure 2I:
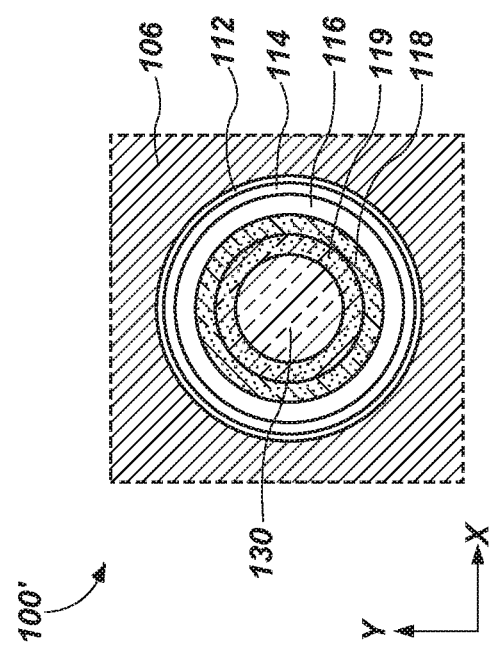

FIG. 2I illustrates a simplified partial top-down view of the device structure 100' of FIG. 2H, taken along section line I-I. The opening 110 (FIG. 2H) may include a substantially round (e.g., substantially circular) horizontal cross-sectional area. In other embodiments, the horizontal cross-sectional shape of the opening 110 may have an alternative shape (e.g., non-curved, non-round, non-circular). As best shown in the top-down view of FIG. 2I, the outer oxide material 112 is laterally adjacent to the conductive materials 106 and the dielectric materials 108 of the stack 104 (FIG. 2H), the nitride material 114 is laterally adjacent to the outer oxide material 112, and the inner oxide material 116 is laterally adjacent to the nitride material 114. The first channel material 118 may be laterally adjacent to the inner oxide material 116, the second channel material 119 may be laterally adjacent to the first channel material 118, and the central dielectric material 130 may be laterally adjacent to the second channel material 119 within the central portion of the opening 110 (FIG. 2H). In some embodiments, the first channel material 118 may be in direct physical contact with and substantially surround (e.g., substantially continuously surround) the second channel material 119, as shown in FIG. 2I. In other embodiments, the positions of the first channel material 118 (e.g., a polysilicon material) and the second channel material 119 (e.g., an oxide semiconductor material) may be reversed such that the first channel material 118 is located directly adjacent to the central dielectric material 130 located within the central portion of the opening 110 and the second channel material 119 may be in direct physical contact with and substantially surround (e.g., substantially continuously surround) the first channel material 118. The inclusion of the second channel material 119 adjacent to the first channel material 118 may enhance electron conductivity without increasing leakage and/or fluctuation of voltage during read and program operations to allow improved reliability, lower leakage, and improved mobility during operation compared to conventional apparatuses having a central dielectric material and a single (e.g., one) channel material. By including the central dielectric material 130, confinement of carriers within a reduced dimension (e.g., width) of the first channel material 118 may result in enhanced channel control.

Thus, in accordance with embodiments of the disclosure, an apparatus comprises a first channel material extending vertically through a stack of alternating dielectric structures and conductive structures, and a second channel material adjacent the first channel material and extending vertically through the stack. A band gap of the second channel material is relatively larger than a band gap of the first channel material. The apparatus further comprises a central dielectric material adjacent the second channel material and extending vertically through the stack.

Figure 3:
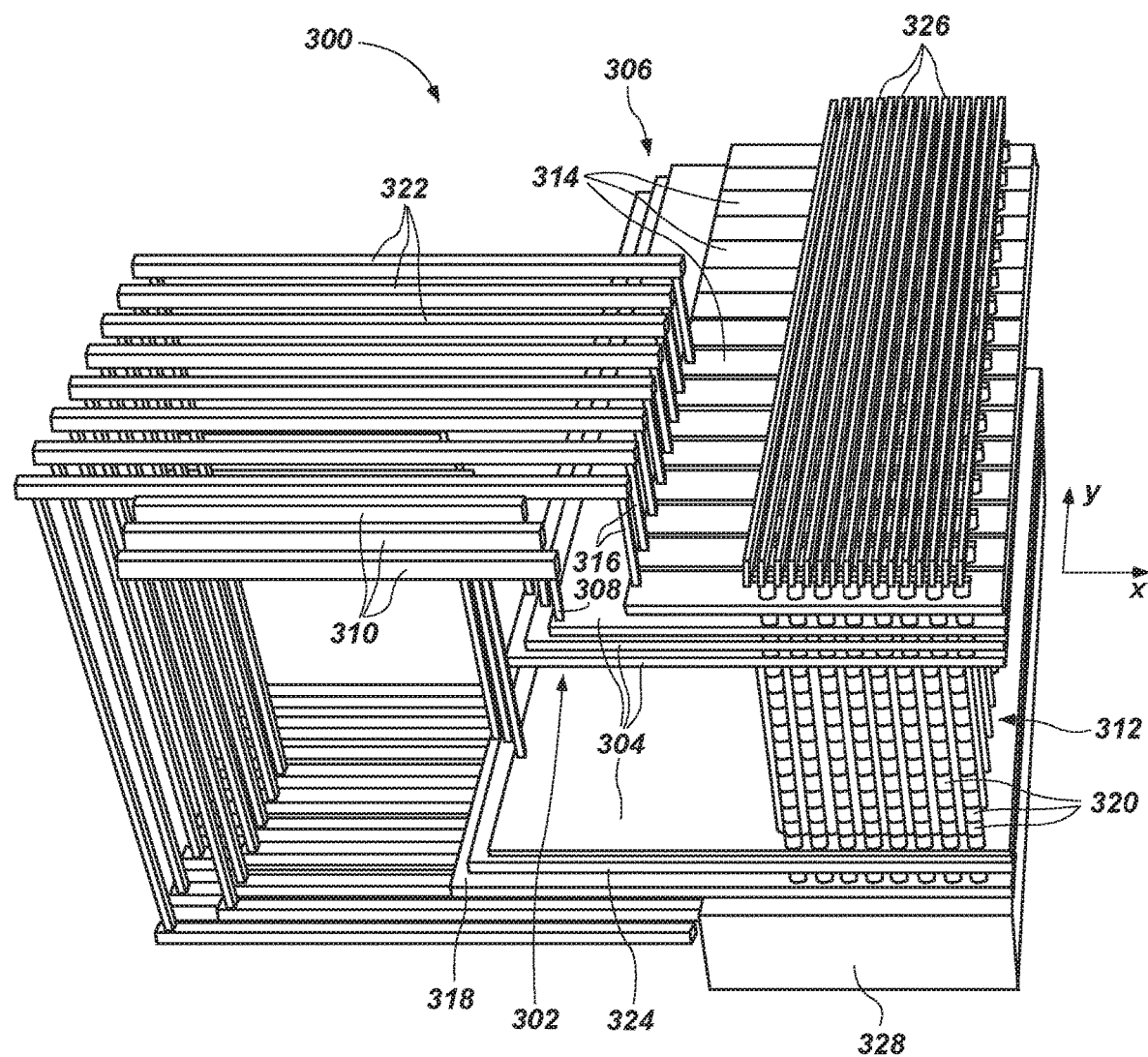
FIG. 3 is a partial cutaway perspective view of a vertical memory device including a microelectronic device structure having a stair step structure, in accordance with an embodiment of the disclosure.

FIG. 3 illustrates a partial cutaway perspective view of a portion of a microelectronic device 300 (e.g., a vertical memory device, such as a 3D NAND Flash memory device)

including a microelectronic device structure 302 including tiers 304 of conductive structures and insulative structures defining a stair step structure 306, and contact structures 308 electrically connected to steps of the stair step structure 306. While a vertical memory device, such as the 3D NAND Flash memory device is shown by way of example, it will be understood by one of ordinary skill in the art that increasing the GIDL current with enhanced BTBT generation while reducing leakage utilizing the second channel material 119 in combination with the second plug material 124 and the first channel material 118 (FIG. 1F) does not depend on a particular storage media and that the second channel material 119 may be utilized in any such memory devices including similar materials and processes. In the present example, the microelectronic device structure 302 (e.g., including the tiers 304 of conductive structures and insulative structures, the stair step structure 306, and the contact structures 308) may be substantially similar to and may be formed in substantially the same manner as the device structures 100, 100' (e.g., including tiers of the conductive materials 106 and the dielectric materials 108) previously described with respect to FIGS. 1A-1H and 2A-2I, respectively. The microelectronic device 300 may further include vertical strings 312 of memory cells 320 coupled to each other in series, data lines 326 (e.g., corresponding to the data line 126 of the device structures 100, 100' shown in FIGS. 1A through 2I), a source tier 318, access lines 310, first select gates 314 (e.g., upper select gates, drain select gates (SGDs)), select lines 322, a second select gate 324 (e.g., a lower select gate, a source select gate (SGS)), and additional contact structures 316. The vertical strings 312 of memory cells 320 extend vertically and orthogonal to conductive lines and tiers (e.g., the data lines 326, the source tier 318, the tiers 304 of the microelectronic device structure 302, the access lines 310, the first select gates 314, the select lines 322, the second select gate 324), and the contact structures 308 and the additional contact structures 316 may electrically couple components to each other as shown (e.g., the select lines 322 to the first select gates 314, the access lines 310 to the tiers 304 of the microelectronic device structure 302). The microelectronic device 300 may also include a control unit 328, which may include one or more of string driver circuitry, pass gates, circuitry for selecting gates, circuitry for selecting conductive lines (e.g., the data lines 326, the access lines 310), circuitry for amplifying signals, and circuitry for sensing signals. The control unit 328 may, for example, be electrically coupled to the data lines 326, source tier 318, access lines 310, first select gates 314, and second select gate 324, for example.

Thus, in accordance with embodiments of the disclosure, a memory device comprises access lines extending in a first lateral direction, data lines extending in a second lateral direction, substantially transverse to the first lateral direction, and memory cells proximate intersections of the access lines and the data lines. The memory cells comprise a first channel material having a first band gap and a second channel material having a second band gap that is relatively larger than the first band gap. The second channel material is laterally adjacent to the first channel material.

Figure 4:
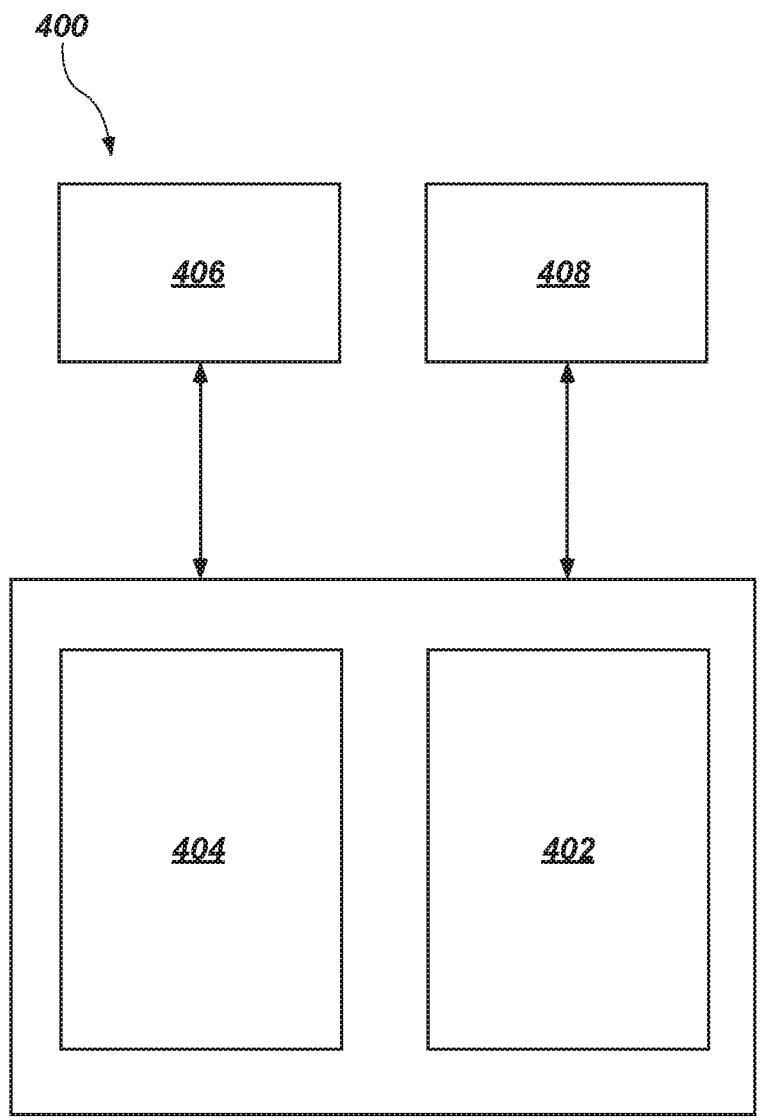
FIG. 4 is a schematic block diagram of an electronic system, in accordance with embodiments of the disclosure.

Microelectronic device structures (e.g., the device structures 100, 100') and microelectronic devices (e.g., the microelectronic device 300) in accordance with embodiments of the disclosure may be used in embodiments of electronic systems of the disclosure. For example, FIG. 4 is a block diagram of an illustrative electronic system 400 according to embodiments of the disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of one or more of a microelectronic device structure (e.g., device structures 100, 100') and a microelectronic device (e.g., the microelectronic device 300) previously described herein. The electronic system 400 may further include at least one electronic signal processor device 404 (often referred to as a "microprocessor"). The electronic signal processor device 404 may, optionally, include an embodiment of a microelectronic device structure (e.g., device structures 100, 100') and a microelectronic device (e.g., the microelectronic device 300) previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, a monitor, a display, a printer, an audio output jack, a speaker, etc. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, in accordance with embodiments of the disclosure, an electronic system comprises a processor and a microelectronic device operably coupled to the processor. The microelectronic device comprises vertical structures extending through a stack of alternating conductive materials and dielectric materials, and data lines adjacent the vertical structures. Each of the vertical structures comprises a channel structure comprising a crystalline material laterally adjacent to and substantially surrounding an amorphous material along a height thereof, and a conductive plug structure adjacent the channel structure. A band gap of the amorphous material of the channel structure is different from that of each of the crystalline material of the channel structure and the conductive plug structure. The electronic system further comprises an uppermost conductive gate structure laterally adjacent the vertical structures. The conductive plug structure at least partially vertically overlaps the uppermost conductive gate structure.

The multiple (e.g., two or more) channel materials disclosed herein may provide enhanced current transmission in 3D memory arrays, which may be suitable for use with devices having an increased number of stacked transistors. The differing (e.g., higher) band gap of the disclosed second channel material may allow for increased GIDL current values for improved reliability, lower leakage, and improved mobility as compared to device structures including only the first channel material, such as polysilicon. The methods facilitate simple and cost-effective formation of the device structures using lower process temperatures and simplified process acts. In addition, the multiple channel materials may be applicable to many 3D memory architectures including select gate source and select gate drain transistors. Scalability may also be enhanced in future generation device structures (e.g., 3D NAND Flash memory device structures) using the multiple channel materials according to embodiments of the disclosure.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. An apparatus, comprising:
   a stack comprising an alternating sequence of dielectric structures and conductive structures;
   a first channel material comprising substantially linear sidewalls extending vertically through the stack, the first channel material having a first band gap;
   a second channel material adjacent to the first channel material and comprising substantially linear sidewalls extending vertically through the stack along an entire height of the first channel material, the second channel material having a second band gap that is relatively larger than the first band gap;
   an oxide-nitride-oxide (ONO) structure comprising substantially linear sidewalls directly laterally adjacent to the first channel material, wherein lower surfaces of the first channel material and the second channel material are vertically elevated relative to a lower surface of the ONO structure;
   a conductive plug structure adjacent to each of the first channel material and the second channel material; and
   a conductive line structure adjacent to the conductive plug structure.

2. The apparatus of claim 1, wherein the conductive plug structure comprises a conductive material having a third band gap, the second band gap being larger than each of the first band gap and the third band gap.

3. The apparatus of claim 2, wherein the third band gap is substantially equal to the first band gap.

4. The apparatus of claim 1, wherein:
   an interface between the second channel material and the first channel material comprises a heterojunction; and
   another interface between the conductive plug structure and the first channel material comprises a homojunction.

5. The apparatus of claim 1, wherein each of the conductive plug structure, the first channel material, and the second channel material comprises an n-type dopant, the second channel material having a greater concentration of the n-type dopant than the conductive plug structure.

6. The apparatus of claim 1, wherein the first channel material is conductive to both electrons and holes, and the second channel material is conductive to electrons and is not conductive to holes, the second channel material having a relatively higher electron mobility than an electron mobility of the first channel material.

7. The apparatus of claim 1, wherein:
   the second channel material laterally extends between sidewalls of the first channel material;
   upper surfaces of the first channel material and the second channel material are substantially coplanar with one another; and
   the conductive plug structure is in direct physical contact with each of the first channel material and the second channel material.

8. The apparatus of claim 1, wherein the first channel material comprises a polycrystalline silicon material and the second channel material comprises an oxide semiconductor material, the first channel material directly physically contacting and substantially surrounding the second channel material along the entire height thereof.

9. An apparatus, comprising:
   a first channel material of a channel structure extending vertically through a stack of alternating dielectric structures and conductive structures;
   a second channel material of the channel structure adjacent to the first channel material and extending vertically through the stack, wherein a band gap of the second channel material is relatively larger than a band gap of the first channel material, each of the first channel material and the second channel material of the channel structure comprising substantially straight sidewalls along a height thereof, and lower surfaces of the first channel material and the second channel material are substantially coplanar with one another;
   a conductive plug structure adjacent to the first channel material and the second channel material; and
   an oxide-nitride-oxide (ONO) material directly contacting the substantially straight sidewalls of the first channel material along the height of the first channel material, the lower surfaces of the first channel material and the second channel material elevated relative to a lower surface of the ONO material.

10. The apparatus of claim 9, wherein outer sidewalls of the conductive plug structure are substantially coplanar with outer sidewalls of the first channel material.

11. The apparatus of claim 9, further comprising a central dielectric material adjacent to the second channel material and extending vertically through the stack, wherein a width of the first channel material is substantially equal to a width of the second channel material, and a width of the central dielectric material is greater than a combined width of the first channel material and the second channel material.

12. The apparatus of claim 11, wherein the width of the first channel material is between about 1 nm and about 20 nm, the width of the second channel material is between about 1 nm and about 20 nm, and the width of the central dielectric material is between about 20 nm and about 100 nm.

13. The apparatus of claim 9, wherein:
   the first channel material comprises a first dopant comprising phosphorous or arsenic; and
   the second channel material comprises a second dopant comprising aluminum or silicon, the second channel material being substantially entirely free of phosphorous and arsenic.

14. A method of forming an apparatus, comprising:
   forming an opening through a stack of alternating conductive structures and dielectric structures;
   forming an oxide-nitride-oxide (ONO) structure comprising substantially linear sidewalls within the opening;
   forming a first channel material within the opening and directly laterally adjacent to the ONO structure, the first channel material comprising substantially linear sidewalls extending vertically through the stack;
   forming a second channel material adjacent to the first channel material within the opening and comprising substantially linear sidewalls extending vertically through the stack along an entire height of the first channel material, lower surfaces of the first channel material and the second channel material vertically elevated relative to a lower surface of the ONO structure;

forming a conductive plug structure within the opening and adjacent to each of the first channel material and the second channel material, a second band gap of the second channel material relatively larger than a first band gap of the first channel material; and forming a conductive line structure adjacent to the conductive plug structure.

15. The method of claim 14, wherein forming the first channel material within the opening comprises conformally forming the first channel material on sidewalls of the stack, the opening having a substantially cylindrical shape.

16. The method of claim 14, wherein forming the second channel material comprises:

non-conformally forming the second channel material on sidewalls of the first channel material; and removing portions of the first channel material and the second channel material within the opening to recess the first channel material and the second channel material below an upper surface of an uppermost conductive material of the stack.

17. The method of claim 14, further comprising forming a central dielectric material on sidewalls of the second channel material and within the opening.

18. The method of claim 14, wherein forming the first channel material and forming the second channel material comprises epitaxially growing at least one of the first channel material and the second channel material within the opening.

19. The method of claim 14, wherein forming the second channel material comprises selecting the second channel material to have a band gap larger than a band gap of the conductive plug structure.

20. A memory device, comprising:

access lines extending in a first lateral direction;

data lines extending in a second lateral direction, substantially transverse to the first lateral direction; and memory cells proximate intersections of the access lines and the data lines, the memory cells comprising:

a first channel material having a first band gap;

a second channel material having a second band gap that is relatively larger than the first band gap, the second channel material laterally adjacent to the first channel material with lower surfaces of the second channel material substantially coplanar with lower surfaces of the first channel material;

a conductive plug adjacent to the first channel material and the second channel material; and an oxide-nitride-oxide (ONO) structure comprising substantially linear sidewalls laterally contacting sidewalls of the first channel material, a lower surface of the ONO structure at an elevational level below the lower surfaces of the first channel material and the second channel material.

21. The memory device of claim 20, wherein the conductive plug and an additional conductive plug are in direct contact with each of the first channel material and the second channel material.

22. The memory device of claim 20, further comprising a central dielectric material laterally adjacent to the second channel material, wherein the first channel material comprises a polycrystalline silicon material, the second channel material comprises an oxide semiconductor material, and the central dielectric material comprises an oxide material.

23. The memory device of claim 20, wherein the first band gap of the first channel material is between about 0.4 eV and about 1.4 eV, and the second band gap of the second channel material is between about 1.5 eV and about 4.0 eV.

24. The memory device of claim 20, wherein the memory device comprises a three-dimensional NAND memory device.

25. An electronic system, comprising:

a processor; and a microelectronic device operably coupled to the processor, the microelectronic device comprising:

vertical structures extending through a stack of alternating conductive materials and dielectric materials, each of the vertical structures comprising:

a channel structure comprising a crystalline material laterally adjacent to and substantially surrounding an amorphous material along a height thereof;

an oxide-nitride-oxide (ONO) structure comprising substantially linear sidewalls laterally adjacent to and substantially surrounding the channel structure, a lower surface of the ONO structure extending beyond a lower surface of the channel structure; and a conductive plug structure adjacent to the channel structure, a band gap of the amorphous material of the channel structure relatively larger than band gaps of each of the crystalline material of the channel structure and the conductive plug structure;

data lines adjacent to the vertical structures; and a conductive gate structure comprising an uppermost one of the conductive materials of the stack laterally adjacent to the vertical structures, the conductive plug structure at least partially vertically overlapping the conductive gate structure.

26. The apparatus of claim 1, wherein end surfaces of the conductive structures proximate the first channel material are substantially aligned with one another.

27. The apparatus of claim 1, wherein a lower portion of the conductive plug structure is laterally aligned with an upper portion of an uppermost one of the conductive structures of the stack.

28. The apparatus of claim 1, wherein upper surfaces of the first channel material and the second channel material are vertically recessed relative to upper surfaces of the ONO structure.

29. The apparatus of claim 1, wherein the conductive plug structure is directly laterally adjacent to the ONO structure, outer sidewalls of each of the first channel material and the conductive plug structure being coincident with inner sidewalls of the ONO structure.

* * * * *

UNITED STATES PATENT AND TRADEMARK OFFICE
CERTIFICATE OF CORRECTION

PATENT NO. : 11,404,583 B2
APPLICATION NO. : 16/781733
DATED : August 2, 2022
INVENTOR(S) : Akira Goda and Marc Aoulaiche It is certified that error appears in the above-identified patent and that said Letters Patent is hereby corrected as shown below:

In the Specification

| | | |
|---|---|---|
| Column 9, | Line 67, | change "10 cm$^2$ V·s" to --10 cm$^2$/V·s-- |
| Column 10, | Line 1, | change "15 cm$^2$V·s" to --15 cm$^2$/V·s-- |
| Column 10, | Line 5, | change "5 cm$^2$ V·s to about 15 cm$^2$ V·s" to --5 cm$^2$/V·s to about 15 cm$^2$/V·s-- |
| Column 11, | Line 56, | change "FIG. IF" to --FIG. 1F-- |
| Column 18, | Line 4, | change "FIG. IF" to --FIG. 1F-- |

Signed and Sealed this
Thirty-first Day of January, 2023

Katherine Kelly Vidal
*Director of the United States Patent and Trademark Office*